(12) United States Patent
Swager et al.

(10) Patent No.: US 8,367,001 B2
(45) Date of Patent: Feb. 5, 2013

(54) EMISSIVE SENSORS AND DEVICES INCORPORATING THESE SENSORS

(75) Inventors: Timothy M. Swager, Newton, MA (US); Shi-Wei Zhang, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/946,685

(22) Filed: Nov. 15, 2010

(65) Prior Publication Data
US 2011/0142717 A1   Jun. 16, 2011

Related U.S. Application Data

(63) Continuation of application No. 10/823,093, filed on Apr. 12, 2004, now abandoned, which is a continuation-in-part of application No. 10/680,714, filed on Oct. 7, 2003, now abandoned, which is a continuation-in-part of application No. 10/324,064, (Continued)

(51) Int. Cl.
*G01N 21/00* (2006.01)
(52) U.S. Cl. ... 422/82.05; 422/98; 422/68.1; 422/82.01; 422/82.07; 422/82.08; 436/127; 436/106; 436/104; 546/348
(58) Field of Classification Search ............ 436/127, 436/106, 104; 422/98, 68.1, 82.01, 82.07, 422/82.08; 546/348
See application file for complete search history.

(56) References Cited

U.S. PATENT DOCUMENTS 3,242,186 A   3/1966 Dershowitz (Continued)

FOREIGN PATENT DOCUMENTS

DE   4121138 A1   1/1993
DE   197 44 792 A1   4/1999

(Continued)

OTHER PUBLICATIONS

Zhang et al., "Fluorescent Detection of Chemical Warfare Agents: Functional Group Specific Ratiometric Chemosensors", J. Am. Chem. Soc. 2003, 125, 3420-3421.*

(Continued)

*Primary Examiner* — Jill Warden
*Assistant Examiner* — Monique Cole
(74) *Attorney, Agent, or Firm* — Wolf, Greenfield & Sacks, P.C.

(57) ABSTRACT

The present invention generally relates to luminescent and/or optically absorbing compositions and/or precursors to those compositions, including solid films incorporating these compositions/precursors, exhibiting increased luminescent lifetimes, quantum yields, enhanced stabilities and/or amplified emissions. The present invention also relates to sensors and methods for sensing analytes through luminescent and/or optically absorbing properties of these compositions and/or precursors. Examples of analytes detectable by the invention include electrophiles, alkylating agents, thionyl halides, and phosphate ester groups including phosphoryl halides, cyanides and thioates such as those found in certain chemical warfare agents. The present invention additionally relates to devices and methods for amplifying emissions, such as those produced using the above-described compositions and/or precursors, by incorporating the composition and/or precursor within a polymer having an energy migration pathway. In some cases, the compositions and/or precursors thereof include a compound capable of undergoing a cyclization reaction.

19 Claims, 16 Drawing Sheets

Related U.S. Application Data filed on Dec. 18, 2002, now Pat. No. 7,208,122, which is a continuation of application No. 09/305,379, filed on May 5, 1999, now abandoned.

(60) Provisional application No. 60/084,247, filed on May 5, 1998.

(56) References Cited

U.S. PATENT DOCUMENTS

| | | | |
|---|---|---|---|
| 3,785,813 | A | 1/1974 | Rickter |
| 4,049,616 | A | 9/1977 | Scott et al. |
| 4,356,429 | A | 10/1982 | Tang |
| 4,513,078 | A | 4/1985 | Sandrik et al. |
| 4,539,507 | A | 9/1985 | VanSlyke et al. |
| 4,687,732 | A | 8/1987 | Ward et al. |
| 4,839,112 | A | 6/1989 | Wynne et al. |
| 4,841,099 | A | 6/1989 | Epstein et al. |
| 4,868,103 | A | 9/1989 | Stavrianopoulos et al. |
| 4,883,608 | A * | 11/1989 | Trujillo et al. ............ 252/189 |
| 4,894,443 | A | 1/1990 | Greenfield et al. |
| 4,927,768 | A | 5/1990 | Coughlin et al. |
| 4,946,890 | A | 8/1990 | Meador |
| 4,957,615 | A | 9/1990 | Ushizawa et al. |
| 4,992,244 | A | 2/1991 | Grate |
| 4,992,302 | A | 2/1991 | Lindmayer |
| 5,091,502 | A | 2/1992 | Narang et al. |
| 5,155,149 | A | 10/1992 | Atwater et al. |
| 5,157,261 | A | 10/1992 | Grey et al. |
| 5,194,393 | A | 3/1993 | Hugl et al. |
| 5,217,715 | A | 6/1993 | Krivan et al. |
| 5,236,808 | A | 8/1993 | Smothers |
| 5,237,582 | A | 8/1993 | Moses |
| 5,244,813 | A | 9/1993 | Walt et al. |
| 5,250,439 | A | 10/1993 | Musho et al. |
| 5,254,633 | A | 10/1993 | Han et al. |
| 5,312,896 | A | 5/1994 | Bhardwaj et al. |
| 5,323,309 | A | 6/1994 | Taylor et al. |
| 5,364,797 | A | 11/1994 | Olson et al. |
| 5,387,462 | A | 2/1995 | Debe |
| 5,414,069 | A | 5/1995 | Cumming et al. |
| 5,451,663 | A | 9/1995 | Kang et al. |
| 5,451,683 | A | 9/1995 | Barrett et al. |
| 5,493,017 | A | 2/1996 | Therien et al. |
| 5,511,547 | A | 4/1996 | Markle et al. |
| 5,512,490 | A | 4/1996 | Walt et al. |
| 5,512,635 | A | 4/1996 | Nubel et al. |
| 5,532,129 | A | 7/1996 | Heller |
| 5,540,999 | A | 7/1996 | Yamamoto et al. |
| 5,546,889 | A | 8/1996 | Wakita et al. |
| 5,549,851 | A | 8/1996 | Fukushima et al. |
| 5,554,747 | A | 9/1996 | Sharma et al. |
| 5,556,524 | A | 9/1996 | Albers |
| 5,563,056 | A | 10/1996 | Swan et al. |
| 5,565,322 | A | 10/1996 | Heller |
| 5,580,527 | A | 12/1996 | Bell et al. |
| 5,585,646 | A | 12/1996 | Kossovsky et al. |
| 5,591,787 | A | 1/1997 | Schlennert et al. |
| 5,597,890 | A | 1/1997 | Jenekhe |
| 5,607,864 | A | 3/1997 | Ricchiero et al. |
| 5,629,353 | A | 5/1997 | Steckle, Jr. et al. |
| 5,674,698 | A | 10/1997 | Zarling et al. |
| 5,674,751 | A | 10/1997 | Jaduszliwer et al. |
| 5,675,001 | A | 10/1997 | Hoffman et al. |
| 5,679,773 | A | 10/1997 | Holmes |
| 5,700,696 | A | 12/1997 | Chandross et al. |
| 5,705,348 | A | 1/1998 | Meade et al. |
| 5,709,994 | A | 1/1998 | Pease et al. |
| 5,710,187 | A | 1/1998 | Steckle, Jr. et al. |
| 5,710,197 | A | 1/1998 | Fischer et al. |
| 5,723,218 | A | 3/1998 | Haugland et al. |
| 5,858,907 | A | 1/1999 | Wang et al. |
| 5,869,592 | A | 2/1999 | Gagné et al. |
| 5,925,517 | A | 7/1999 | Tyagi et al. |
| 5,942,638 | A | 8/1999 | Lichtenhan et al. |
| 5,998,204 | A | 12/1999 | Tsien et al. |
| 6,020,426 | A | 2/2000 | Yamaguchi et al. |
| 6,124,421 | A | 9/2000 | Lau et al. |
| 6,254,829 | B1 | 7/2001 | Hartmann et al. |
| 6,259,277 | B1 | 7/2001 | Tour et al. |
| 6,303,733 | B1 | 10/2001 | Lau et al. |
| 6,323,309 | B1 | 11/2001 | Swager et al. |
| 6,328,932 | B1 | 12/2001 | Carter et al. |
| 6,444,476 | B1 | 9/2002 | Morgan |
| 6,444,479 | B1 | 9/2002 | Choi |
| 6,469,123 | B1 | 10/2002 | Lau et al. |
| 6,509,110 | B1 | 1/2003 | Salbeck et al. |
| 6,556,335 | B2 | 4/2003 | Lee et al. |
| 6,589,731 | B1 | 7/2003 | Chen et al. |
| 6,605,693 | B1 | 8/2003 | Becker et al. |
| 6,610,848 | B1 | 8/2003 | Pilato et al. |
| 6,660,820 | B1 | 12/2003 | Martin et al. |
| 6,670,645 | B2 | 12/2003 | Grushin et al. |
| 6,713,298 | B2 | 3/2004 | McDevitt et al. |
| 6,743,640 | B2 | 6/2004 | Whitten et al. |
| 6,770,220 | B1 | 8/2004 | Klimant |
| 6,783,814 | B2 | 8/2004 | Swager et al. |
| 6,828,450 | B2 | 12/2004 | Hua et al. |
| 6,830,828 | B2 | 12/2004 | Thompson et al. |
| 6,835,835 | B1 | 12/2004 | Huo |
| 6,902,830 | B2 | 6/2005 | Thompson et al. |
| 6,919,139 | B2 | 7/2005 | Grushin et al. |
| 6,946,688 | B2 | 9/2005 | Grushin et al. |
| 6,962,757 | B2 | 11/2005 | Epstein et al. |
| 7,001,536 | B2 | 2/2006 | Thompson et al. |
| 7,029,765 | B2 | 4/2006 | Kwong et al. |
| 7,041,910 | B2 | 5/2006 | Swager et al. |
| 7,075,102 | B2 | 7/2006 | Grushin et al. |
| 7,078,725 | B2 | 7/2006 | Grushin et al. |
| 7,087,321 | B2 | 8/2006 | Kwong et al. |
| 7,088,757 | B1 | 8/2006 | Yu et al. |
| 7,098,060 | B2 | 8/2006 | Yu et al. |
| 7,122,383 | B2 | 10/2006 | Jones et al. |
| 7,129,518 | B2 | 10/2006 | Grushin et al. |
| 7,186,355 | B2 | 3/2007 | Swager et al. |
| 7,208,122 | B2 | 4/2007 | Swager et al. |
| 7,250,519 | B2 | 7/2007 | Stossel et al. |
| 7,291,503 | B2 | 11/2007 | Swager et al. |
| 7,393,503 | B2 | 7/2008 | Swager et al. |
| 7,417,146 | B2 | 8/2008 | Huo |
| 7,462,325 | B2 | 12/2008 | Hancock et al. |
| 7,521,232 | B2 | 4/2009 | Moon |
| 7,662,309 | B2 | 2/2010 | Swager et al. |
| 7,671,166 | B2 | 3/2010 | Swager et al. |
| 7,759,127 | B2 | 7/2010 | Rose et al. |
| 7,943,062 | B2 | 5/2011 | Swager et al. |
| 8,158,437 | B2 | 4/2012 | Swager et al. |
| 8,198,096 | B2 | 6/2012 | Swager et al. |
| 2002/0040805 | A1 | 4/2002 | Swager et al. |
| 2002/0051985 | A1 | 5/2002 | Whitten et al. |
| 2002/0076830 | A1 | 6/2002 | Mauze et al. |
| 2002/0137978 | A1 | 9/2002 | Grubbs et al. |
| 2002/0150697 | A1 | 10/2002 | Swager et al. |
| 2002/0150759 | A1 | 10/2002 | Jones et al. |
| 2002/0177136 | A1 | 11/2002 | McBranch et al. |
| 2003/0054413 | A1 | 3/2003 | Kumaraswamy et al. |
| 2003/0096138 | A1 | 5/2003 | Lecloux et al. |
| 2003/0134959 | A1 | 7/2003 | Hancock et al. |
| 2003/0178607 | A1 | 9/2003 | Swager et al. |
| 2004/0043251 | A1 | 3/2004 | Epstein et al. |
| 2004/0089867 | A1 | 5/2004 | Grushin et al. |
| 2004/0094768 | A1 | 5/2004 | Yu et al. |
| 2004/0094769 | A1 | 5/2004 | Grushin et al. |
| 2004/0106741 | A1 | 6/2004 | Kriesel et al. |
| 2004/0116650 | A1 | 6/2004 | Swager et al. |
| 2004/0121337 | A1 | 6/2004 | Deans et al. |
| 2004/0170775 | A1 | 9/2004 | Swager et al. |
| 2004/0175768 | A1 | 9/2004 | Kushon et al. |
| 2004/0188673 | A1 | 9/2004 | Grushin et al. |
| 2004/0197602 | A1 | 10/2004 | Dobbs et al. |
| 2004/0235184 | A1 | 11/2004 | Swager |
| 2004/0241768 | A1 | 12/2004 | Whitten et al. |
| 2004/0254388 | A1 | 12/2004 | Spreitzer et al. |
| 2005/0014160 | A1 | 1/2005 | Kumaraswamy et al. |
| 2005/0037232 | A1 | 2/2005 | Tyan et al. |

| | | | |
|---|---|---|---|
| 2005/0054854 A1 | 3/2005 | Stossel et al. | |
| 2005/0059168 A1 | 3/2005 | Bazan et al. | |
| 2005/0147534 A1 | 7/2005 | Swager et al. | |
| 2005/0157261 A1 | 7/2005 | Hanebuchi et al. | |
| 2005/0176624 A1 | 8/2005 | Thompson et al. | |
| 2005/0186447 A1 | 8/2005 | Grushin et al. | |
| 2005/0196775 A1 | 9/2005 | Swager et al. | |
| 2005/0220714 A1 | 10/2005 | Kauzlarich et al. | |
| 2005/0226775 A1 | 10/2005 | Aker et al. | |
| 2005/0263758 A1 | 12/2005 | Treacher et al. | |
| 2005/0285517 A1 | 12/2005 | Yu et al. | |
| 2006/0024707 A1 | 2/2006 | Deans et al. | |
| 2006/0029829 A1 | 2/2006 | Thompson et al. | |
| 2006/0057425 A1 | 3/2006 | Grushin et al. | |
| 2006/0058524 A1 | 3/2006 | Falcou et al. | |
| 2006/0073607 A1 | 4/2006 | Rose et al. | |
| 2006/0120917 A1 | 6/2006 | Swager et al. | |
| 2006/0127929 A1 | 6/2006 | Swager et al. | |
| 2006/0135772 A1 | 6/2006 | Huo | |
| 2006/0173145 A1 | 8/2006 | Pawlow et al. | |
| 2006/0270846 A1 | 11/2006 | Karpishin et al. | |
| 2007/0081921 A1 | 4/2007 | Swager et al. | |
| 2007/0083066 A1 | 4/2007 | Bohm et al. | |
| 2008/0085566 A1 | 4/2008 | Swager et al. | |
| 2009/0215189 A1 | 8/2009 | Swager et al. | |
| 2010/0063225 A1 | 3/2010 | Swager et al. | |
| 2010/0112715 A1 | 5/2010 | Swager et al. | |
| 2010/0168352 A1 | 7/2010 | Arriola et al. | |
| 2010/0213451 A1 | 8/2010 | Swager et al. | |
| 2010/0310424 A1 | 12/2010 | Rose et al. | |
| 2011/0175035 A1 | 7/2011 | Swager et al. | |

FOREIGN PATENT DOCUMENTS

| | | |
|---|---|---|
| DE | 198 06 037 A1 | 9/1999 |
| EP | 0 259 951 A2 | 3/1988 |
| EP | 0 442 123 A1 | 8/1991 |
| EP | 0 581 058 A1 | 2/1994 |
| EP | 0 748 805 A1 | 12/1996 |
| EP | 1 011 154 A1 | 6/2000 |
| JP | 06-322078 | 11/1994 |
| WO | WO 89/00593 | 1/1989 |
| WO | WO 95/16681 | 6/1995 |
| WO | WO-98/05693 A1 | 2/1998 |
| WO | WO 99/19419 A1 | 4/1999 |
| WO | WO 99/57222 A1 | 11/1999 |
| WO | WO-00/05774 A1 | 2/2000 |
| WO | WO 00/53655 A1 | 9/2000 |
| WO | WO 01/57140 A1 | 8/2001 |
| WO | WO 02/16463 A2 | 2/2002 |
| WO | WO-02/074997 A1 | 9/2002 |
| WO | WO-02/079268 A2 | 10/2002 |
| WO | WO 03/048226 A2 | 6/2003 |
| WO | WO 2004/057014 A2 | 7/2004 |
| WO | WO-2005/030681 A1 | 4/2005 |
| WO | WO-2005/086617 A2 | 9/2005 |
| WO | WO 2006/081345 A1 | 8/2006 |
| WO | WO-2006/085319 A2 | 8/2006 |
| WO | WO-2008/019086 A2 | 2/2008 |
| WO | WO-2008/039529 A1 | 4/2008 |
| WO | WO-2008/042289 A2 | 4/2008 |
| WO | WO-2008/136805 A2 | 11/2008 |

OTHER PUBLICATIONS

Abraham et al., "Hydrogen bonding. Part 29. Characterization of 14 Sorbent Coatings for Chemical Microsensors using a New Solvation Equation," J. Chem. Soc. Perkin Trans. 1995, 2, 369-378.

Achyuthan et al., "Fluorescence Superquenching of Conjugated Polyelectrolytes: Applications for Biosensing and Drug Discovery," J. Mat. Chem. 2005, 15, 2648.

Amara et al., "Synthesis and Properties of Poly(phenylene ethynylene)s with Pendant Hexafluoro-2-propanol Groups," Macromolecules 2005, 38, 9091-9094.

Bergstedt et al., "Superquenching of Fluorescent Polyelectrolytes and its Applications for Chemical and Biological Sensing," Proc. SPIE 2001, 4279, 94.

Brabec, Christoph, et al. "Plastic Solar Cells", Adv. Funct. Mater, 2001, vol. 11, No. 1, pp. 15-26.

Chen et al., "Tuning the Properties of Conjugated Polyelectrolytes through Surfactant Complexation," J. Am. Chem. Soc. 2000, 122, 9302-9303.

Chen et al., "Surfactant-induced Modification of Quenching of Conjugated Polymer Fluorescence by Electron Acceptors: Applications for Chemical Sensing," Chem. Phys. Lett. 2000, 330, 27.

Chen, Liaohai, et al., "Highly Sensitive Biological and Chemical Sensors Based on Reversible Fluorescence Quenching in a Conjugated Polymer," Proceedings of the National Academy of Sciences of the United States of America, Oct. 26, 1999, vol. 96, No. 22, pp. 12287-12292.

Chen, Liaohai, et al., "Tuning the Properties of Conjugated Polyelectrolytes through Surfactant Complexation," Journal of the American Chemical Society, 2000, vol. 122 No. 38, pp. 9302-9303.

Cotts, Patricia M., et al., "Equilibrium Flexibility of a Rigid Linear Conjugated Polymer," Macromolecules, 1996, vol. 29, pp. 7323-7328.

Dagani, Ron, "A Better Sensor for Nerve Gas," C&EN, Mar. 10, 2003, p. 12.

Deans, Robert, et al., "A Poly($p$-phenyleneethynylene) with a Highly Emissive Aggregated Phase", J. Am. Chem. Soc., 2000, vol. 122, pp. 8565-8566.

Deng et al., "Direct Observation of the "Pac-Man" Effect from Dibenzofuran-Bridged Cofacial Bisporphyrins," J. Am. Chem. Soc. 2000, 122, 410-411.

Fan et al., "Beyond Superquenching: Hyper-Efficient Energy Transfer from Conjugated Polymers to Gold Nanoparticles," PNAS 2003, 100(11), 6297.

Fan et al., "High-Efficiency Fluorescence Quenching of Conjugated Polymers by Proteins," J. Am. Chem. Soc. 2002, 124, 5642.

Fan et al., "Photoluminescence Quenching of Water-Soluble, Conjugated Polymers by Viologen Derivatives: Effect of Hydrophobicity," Langmuir 2003, 19, 3554. Published on Web, Mar. 19, 2003.

Fiesel, Rainer, et al., "A chiral poly($para$-phenyleneethynylene) (PPE) derivative," Macromol. Rapid Commun., 1998, vol. 19, No. 8, pp. 427-431.

Fiesel, Rainer, et al., "Aggregation-induced CD effects in chiral poly(2,5-dialkoxy-1,4-phenylene)s," Acta Polym., 1998, vol. 49, pp. 445-449.

Fiesel, Rainer, et al., "On the Solid State Aggregation of Chiral Substituted Poly($para$-phenylene)s (PPPs)," Synthetic Metals, 1999, vol. 102, pp. 1457-1458.

Fu, Dian-Kui, et al., "Alternating Poly(PyridylVinylenePhenyleneVinylene)s: Synthesis and Solid State Organizations," Tetrahedron, 1997, vol. 53, No. 45, pp. 15487-15494.

Gaylord et al., "DNA Hybridization Detection with Water-Soluble Conjugated Polymers and Chromophore-Labeled Single-Stranded DNA," J. Am. Chem. Soc. 2003, 125, 896.

Gaylord et al., "SNP Detection Using Peptide Nucleic Acid Probes and Conjugated Polymers: Applications in Neurodegenerative Disease Identification," PNAS 2005, 102(1), 34.

Gaylord, Brent S., et al., "DNA detection using water-soluble conjugated polymers and peptide nucleic acid probes," PNAS, Aug. 20, 2002, vol. 99, No. 17, pp. 10954-10957.

Gaylord, Brent S., et al., "Water-Soluble Conjugated Oligomers: Effect of Chain Length and Aggregation on Photoluminescence-Quenching Efficiencies," J. Am. Chem. Soc., Jun. 8, 2001, vol. 123, No. 26, pp. 6417-6418.

Goldfinger, M. et al., "Fused Polycyclic Aromatics via Electrophile-Induced Cyclization Reactions: Application to the Synthesis of Graphite Ribbons", Journal of the American Chemical Society, 116, (1994), pp. 7895-7896.

Grate et al., "Hydrogen Bond Acidic Polymers for Surface Acoustic Wave Vapor Sensors and Arrays," Anal. Chem. 1999, 71, 1033-1040.

Grate, "Acoustic Wave Microsensor Arrays for Vapor Sensing," Chem Rev. 2000, 100, 2627-2648.

Halkyard, C. et al., "Evidence of Aggregate Formation for 2,5-Dialkylpoly($p$-phenyleneethynylenes) in Solution and Thin Films," Macromolecules, 1998, 31(25), 8655-8659.

Halkyard, Carrie E., et al., "Evidence of Aggregate Formation for 2,5-Dialkylpoly (p-phenyleneethynylenes) in Solution and Thin Films," *Macromolecules*, Nov. 25, 1998, vol. 31, No. 25, pp. 8655-8659.

Harrison, B. et al., "Amplified Fluorescence Quenching in a Poly(p-phenylene)-Based Cationic Polyelectrolyte," *J. Am. Chem. Soc.*, 2000, 122(35), 8561-8562.

Harrison, Benjamin S., et al., "Amplified Fluorescence Quenching in a Poly(p-phenylene)-Based Cationic Polyelectrolyte," *J. Am. Chem. Soc.*, Aug. 16, 2001, vol. 122, No. 35, pp. 8561-8562.

Heeger, Peter S., et al., "Making Sense of Polymer-Based Biosensors," Proceedings of the National Academy of Sciences of the United States of America, Oct. 26, 1999, vol. 96, No. 22, pp. 12219-12221.

Herbich et al. "Fluorescence Quenching by Pyridine and Derivatives Induced by Intermolecular Hydrogen Bonding to Pyrrole-Containing Heteroaromatics," J. Phys. Chem. A. 2002, 106, 2158-2163.

Hoffmeister et al., "Triptycene Polymers," J. Polymer Science 1969, 7, 55-72.

Höger, S. et al., "Synthesis, Aggregation, and Adsorption Phenomena of Shape-Persistent Macrocycles with Extraannular Polyalkyl Substituents," *J. Am. Chem. Soc.*, 2001, 123(24), 5651-5659.

Höger, Sigurd, et al., "Synthesis, Aggregation, and Adsorption Phenomena of Shape-Persistent Macrocycles with Extraannular Polyalkuly Substituents," *J. Am. Chem. Soc.*, May 22, 2001, vol. 123, No. 24, pp. 5651-5659.

Jones et al., "Building Highly Sensitive Dye Assemblies for Biosensing from Molecular Building Blocks," PNAS 2001, 98(26), 14769.

Jones et al., "Tuning of Superquenching in Layered and Mixed Fluorescent Polyelectrolytes," J. Am. Chem. Soc. 2001, 123, 6726.

Jones, Robert M., et al., "Superquenching and Its Application in J-Aggregated Cyanine Polymers," *Langmuir*, Apr. 4, 2001, vol. 17, No. 9, pp. 2568-2571.

Kim, Jinsang, et al., "Control of conformational and interpolymer effects in conjugated polymers," *Nature*, Jun. 28, 2001, vol. 411, pp. 1030-1034.

Kim, Jinsang, et al., "Directing Energy Transfer within Conjugated Polymer Thin Films," *J. Am. Chem. Soc.*, Nov. 21, 2001, vol. 123, No. 46, pp. 11488-11489.

Kim, Jinsang, et al., "Ion-Specific Aggregation in Conjugated Polymers: Highly Sensitive and Selective Fluorescent Ion Chemosensors," *Angew. Chem. Int. Ed.*, 2000, vol. 39, No. 21, pp. 3868-3872.

Kim, Jinsang, et al., "Nanoscale Fibrils and Grids: Aggregated Structures from Rigid-Rod Conjugated Polymers," *Macromolecules*, vol. 32, No. 5, pp. 1500-1507, 1999.

Kim, Jinsang, et al., "Structural Control in Thin Layers of Poly)P-phenyleneethynynlene)s: Photophysical Studies of Langmuir and Langmuir-Blodgett Films," *J. Am. Chem. Soc.*, Jul. 3, 2002, vol. 124, No. 26, p. 7710-7718.

Kim, T.-H. et al., "A Fluorescent Self-Amplifying Wavelength Responsive Sensory Polymer for Fluoride Ion," *Angew. Chem. Int. Ed.* 2003, 42, 4803-4806.

Kim, Yong Hee, et al., "Ultrafast Energy-Transfer Dynamics between Block Copolymer and π-Conjugated Polymer Chains in Blended Polymeric Systems," *Chemistry of Materials*, vol. 13(8), pp. 266.

Köhler, Bernhard, et al., "Novel Chiral Macrocycles Containing Two Electronically Interacting Arylene Chromophores," *Chem. Eur. J.*, 2001, vol. 7, No. 14, pp. 3000-3004.

Kraft, Arno, et al., "Electroluminescent Conjugated Polymers—Seeing Polymers in a New Light," *Agnew. Chem. Int. Ed.* 1998, 37, 402-428.

Kumaraswamy et al., "Fluorescent-Conjugated Polymer Superquenching Facilitates Highly Sensitive Detection of Proteases," PNAS 2004, 101(24), 7511.

Kushon et al., "Detection of Single Nucleotide Mismatches via Fluorescent Polymer Superquenching," Langmuir 2003, 19, 6456.

Kushon, Stuart A., et al., "Detection of DNA Hybridization via Fluorescent Polymer Superquenching," *Langmuir*, The ACS Journal of Surfaces and Colloids, Oct. 1, 2002, vol. 18, No. 20, pp. 7245-7249.

Langveld, B.M.W., et al., "Circular Dichroism and Circular Polarization of Photoluminescence of Highly Ordered Poly{3,4-di[(S)-2-methylbutoxy]thiophene}," *J. Am. Chem. Soc.*, 1996, vol. 118, No. 20, pp. 4908-4909.

Levitsky, et al., "Rational Design of a Nile Red/Polymer Composite Film for Fluorescence Sensing of Organophosphonate Vapors Using Hydrogen Bond Acidic Polymers," Anal. Chem. 2001, 73, 3441-3448.

Levitsky, et al., "Signal Amplification in Multichromophore Luminescence-Based Sensors," J. Phys. Chem. B, 2001, 105, 8468-8473.

Levitsky, I. et al., "Energy Migration in a Poly(phenylene ethynylene): Determination of Interpolymer Transport in Anisotropic Langmuir-Blodgett Films," *J. Am. Chem. Soc.*, 1999, 121(7), 1466-1472.

Levitsky, Igor A., et al., "Energy Migration in a Poly(phenylene ethynylene): Determination of Interpolymer Transport in Anisotropic Langmuir-Blodgett Films," *J. Am. Chem. Soc.*, 1999, vol. 121, No. 7, pp. 1466-1472.

Levitsky, Igor A., et al., "Mass and Energy Transport in Conjugated Polymer Langmuir-Blodgett Films; Conductivity, Fluorescence, and UV-Vis Studies," *Macromolecules*, Mar. 27, 2001, vol. 34, No. 7, pp. 2315-2319.

Li, M. et al., "Novel Surfactant-Free Stable Colloidal Nanoparticles Made of Randomly Carboxylated Polystyrene Ionomers," *Macromolecules*, 1997, 30(7), 2201-2203.

Li, Mei, et al., "Novel Surfactant-Free Stable Colloidal Nanoparticles Made of Randomly Carboxylated Polystyrene Ionomers," *Macromolecules*, 1997, vol. 30, No. 7, pp. 2201-2203.

Liu et al., "Homogeneous Fluorescence-Based DNA Detection with Water-Soluble Conjugated Polymers," Chem Mater. 2004, 16, 4467.

Liu et al., "Methods for Strand-Specific DNA Detection with Cationic Conjugated Polymers Suitable for Incorporation into DNA Chips and Microarray," PNAS 2005, 102(3), 589.

Liu et al., "Optimization of the Molecular Orbital Energies of Conjugated Polymers for Optical Amplification of Fluorescent Sensors," J. Am. Chem. Soc. 2006, 128, 1188.

Lu et al., "'Cyanine Pendant' Polymers on Nanoparticles and in Solution; Superquenching and Sensing Applications," Polym. Mat. Sci. Eng. 2002, 86, 17.

Lu et al., "Biocidal Activity of a Light-Absorbing Fluorescent Conjugated Polyelectrolyte," Langmuir 2005, 21, 10154.

Lu et al., "Self-Assembled 'Polymers' on Nanoparticles: Superquenching and Sensing Applications," Polymer Preprints, 2002, 43, 124.

Lu et al., "Superquenching in Cyanine Pendant Poly($_L$-lysine) Dyes: Dependence on Molecular Weight, Solvent, and Aggregation," J. Am. Chem. Soc. 2002, 124(3), 483.

Lu et al., "Surface-Enhanced Superquenching of Cyanine Dyes as J-Aggregates on Laponite Clay Nanoparticles," Langmuir 2002, 18, 7706.

Luo, L. et al., "Thermodynamic Stabilization Mechanism of Block Copolymer Vesicles," *J. Am. Chem. Soc.* 2001, 123(5), 1012-1013.

Martin, et al., "Picosecond Laser Photolysis Studies of Deactivation Processes of Excited Hydrogen-Bonding Complexes. 2. Dibenxocarbazole-Pyridine Systems," J. Phys. Chem. 1982, 86, 4148-4156.

McGill, et al., "Choosing polymer coatings for chemical sensors," Chemtech 1994, 24, 27-37.

McQuade, D. Tyler, et al., "Conjugated Polymer-Based Chemical Sensors," *Chem. Rev.*, 2000, vol. 100, No. 7, pp. 2537-2574.

McQuade, D. Tyler, et al., "Two-Dimensional Conjugated Polymer Assemblies: Interchain Spacing for Control of Photophysics," *J. Am. Chem. Soc.*, 2000, vol. 122, No. 24, pp. 5885-5886.

Miao, Yi-Jun, et al., "Fluorescence Sensory Polymers Containing Rigid Non-planar Aromatic Scaffolds," Proceedings of the 1997 Boston meeting, vol. 39, No. 2, pp. 1081-1082, Aug. 23-27, 1998, Polym. Prepr. Div. Polym. Chem. Am. Chem. Soc.; Polymer Preprints, Division of Polymer Chemistry, American Chemical Society, Aug. 1998 ACS, Washington D.C.

Mitschke, Ullrich et al., "The electroluminescence of organic materials," *J. Mater. Chem.*, 2000, vol. 10, pp. 1471-1507.

Miyasaka, et al., "Femtosecond-Picosecond Laser Photolysis Studies on the Mechanisms of Fluorescence Quenching Induced by Hydrogen-Bonding Interactions—1-Pyrenol-Pyridine Systems," J. Phys. Chem. 1993, 97, 8222-8228.

Moon, Joong Ho, et al., "Capture and detection of a quencher labeled oligonucleotide by poly)phenylene ethynylene) particles," *Chem. Commun.*, Jan. 2003, vol. 1, pp. 104-105.

Oda, Masao, et al., "Chiroptical properties of chiral-substituted polyfluorenes," *Synthetic Metals*, 2000, vol. 111-112, pp. 575-577.

Oda, Masao, et al., "Circularly Polarized Electroluminescence from Liquid-Crystalline Chiral Polyfluorenes," *Advanced Materials*, 2000, vol. 12, No. 5, pp. 362-365.

Patel, et al., "Chemicapacitive microsensors for volatile organic compound detection," Sensors and Actuators B, 2003, 96, 541-553.

Peeters, Emiel, et al., "Circularly Polarized Electroluminescence from a Polymer Light-Emitting Diode," *J. Am. Chem. Soc.*, 1997, vol. 119, No. 41, pp. 9909-9910.

Peng, Kang-Yung, et al., "Efficient Light Harvesting by Sequential Energy Transfer across Aggregates in Polymers of Finite Conjugational Segments with Short Aliphatic Linkages," *J. Am. Chem. Soc.*, 2001, vol. 123, pp. 11388-11397.

Pinnaduwage, et al., "Detection of 2,4-dinitrotoluene using microcantilever sensors," Sensors and Actuators B, 2004, 99, 223-229.

Place, I. et al., "Stabilization of the Aggregation of Cyanine Dyes at the Molecular and Nanoscopic Level," *Langmuir* 2000, 16(23), 9042-9048.

Pschirer, N. et al., "Poly(fluorenyleneethynylene)s by Alkyne Metathesis: Optical Properties and Aggregation Behavior," *Macromolecules* 2000, 33(11), 3961-3963.

Rininsland et al., "High-Throughput Kinase Assays with Protein Substrates Using Fluorescent Polymer Superquenching," MBC Biotech. 2005, 5, 16.

Rininsland et al., "Metal Ion-Mediated Polymer Superquenching for Highly Sensitive Detection of Kinase and Phosphatase Activities," PNAS 2004, 101(43), 15295.

Snow A.W., et al., "Synthesis and Evaluation of Hexafluorodimethylcarbinol Functionalized Polymers as Microsensor Coatings," *Journal of Applied Polymer Science* 1991, vol. 43, pp. 1659-1671.

Swager, Timothy M., "The Molecular Wire Approach to Sensory Signal Amplification," *Acc. Chem. Res.*, 1998, vol. 31, No. 5, pp. 201-207.

Swager, Timothy M., et al., "Fluorescence Studies of Poly(p-phenyleneethynylene)s: The Effect of Anthracene Substitution," *J. Phys. Chem.*, 1995, vol. 99, No. 14, pp. 4886-4893.

Tan, Chunyan, et al., "Photophysics, aggregation and amplified quenching of a water-soluble poly(phenylene ethynylene)," *Chem. Commun.*, 2002, pp. 446-447.

Thomas, III et al. "Trace Hydrazine Detection with Fluorescent Conjugated Polymers: A Turn-On Sensory Mechanism," Adv. Materials 2006, 18, 1047-1050.

Thomas, III et al., "Amplifying fluorescent polymer sensors for the explosives taggant 2,3-dimethyl-2,3-dinitrobutane (DMNB)," Chem. Commun. 2005, 4572-4574.

Thomas, III et al., "Conjugated Polymer Sensors: Design Principles Towards Enhanced Versatility," presented at the Army Science Conference, Dec. 2004.

Thomas, III et al., "Conjugated Polymer Sensors: Detection of DMNB and Hydrazine," presented to the American Chemical Society at the 230th National Meeting, Washington, D.C. (Aug. 28-Sep. 1, 2005).

Thomas, III et al., "Conjugated Polymer Sensors: Detection of DMNB and Hydrazine," presented at the Materials Research Symposium, Boston, MA (Dec. 2005).

Van Houten, Kelly A., et al., "Rapid Luminescent Detection of Phosphate Esters in Solution and the Gas Phase Using (dppe)Pt{S2C2(2-pyridyl)(CH2CH2OH)}," *J. Am. Chem. Soc.*, 1998, vol. 120, No. 47, pp. 12359-12360.

Walters, Keith A., et al., "Photophysical Consequences of Conformation and Aggregation in Dilute Solutions of π-Conjugated Oligomers," *Langmuir*, 1999, vol. 15, pp. 5676-5680.

Waluk, "Hydrogen-Bonding-Induced Phenomena in Bifunctional Heteroazaaromatics," Acc. Chem. Res. 2003, 36, 832-838.

Wang et al., "Biosensors from Conjugated Polyelectrolyte Complexes," PNAS 2002, 99(1), 49.

Wang et al., "Fluorescein Provides a Resonance Gate for FRET from Conjugated Polymers to DNA Intercalated Dyes," J. Am. Chem. Soc. 2004, 126, 5446.

Wang et al., "Photoluminescence of Water-Soluble Conjugated Polymers: Origin of Enhanced Quenching by Charge Transfer," Macromolecules 2000, 33, 5153.

Wang et al., "Photoluminescence Quenching of Conjugated Macromolecules by Bipyridinium Derivatives in Aqueous Media: Charge Dependence," Langmuir 2001, 17, 1262.

Weder, Christoph, et al., "Efficient Solid-State Photoluminescence in New Poly(2,5-dialkoxy-*p*-phenyleneethynylene)s," *Macromolecules*, 1996, vol. 29, No. 15, pp. 5157-5165.

Whitten et al., "From Superquenching to Biodetection: Building Sensors Based on Fluorescent Polyelectrolytes," Chapter 4, *Optical Sensors and Switches*, New York: Marcel Dekker, 2001.

Wu, C. et al., "Novel Nanoparticles Formed via Self-Assembly of Poly(ethylene glycol-*b*-sebacic anhydride) and Their Degradation in Water," *Macromolecules*, 2000, 33(24), 9040-9043.

Xia et al., "A High-Throughput Screening Assay for Kinases and Phosphatases via Metal Ion-Mediated Fluorescent Polymer Superquenching," American Laboratory 2004, 36, 15.

Xia et al., "Applications of Fluorescent Polymer Superquenching to High Throughput Screening Assays for Protein Kinases," Assay and Drug Dev. Tech. 2004, 2, 183.

Yang, Jye-Shane, et al., "Anomalous crystal packing of iptycene secondary diamides leading to novel chain and channel networks," *Tetrahedron Letters*, Oct. 7, 2000, vol. 41, Issue 41, pp. 7911-7915.

Yang, Jye-Shane, et al., "Fluorescent Porous Polymer Films as TNT Chemosensors: Electronic and Structural Effects," *J. Am. Chem. Soc.*, 1998, vol. 120, No. 46, pp. 11864-11873.

Yang, Jye-Shane, et al., "Porous Shape Persistent Fluorescent Polymer Films: An Approach to TNT Sensory Materials," *J. Am. Chem. Soc.*, Jun. 3, 1998, vol. 120, No. 21, pp. 5321-5322.

Zhang, G. et al., "Formation of Novel Polmeric Nanoparticles," *Acc. Chem. Res.*, 2001, 34(3), 249-256.

Zhang, Guangzhao, et al., "Formation of Novel Polymeric Nanoparticles," *Accounts of Chemical Research*, Jan. 6, 2001, vol. 34, No. 3, pp. 249-256.

Zhang, S. et al., "Fluorescent Detection of Chemical Warfare Agents: Functional Group Specific Ratiometric Chemosensors," *J. Am. Chem. Soc.*, 2003, 125(12), 3420-3421.

Zhang, Shi-Wei, et al., "Fluorescent Detection of Chemical Warfare Agents: Specific Ratiometric Chemosensors," *J. Am. Chem. Soc.*, vol. 125, pp. 3420-3423.

Zhou, Qin, et al. "Fluorescent Chemosensors Based on Energy Migration in Conjugated Polymers: The Molecular Wire Approach to Increased Sensitivity," *J. Am. Chem. Soc.*, 1995, vol. 117, No. 50, pp. 12593-12602.

Zhou, Qin, et al., "Methodology for Enhancing the Sensitivity of Fluorescent Chemosensors: Energy Migration in Conjugated Polymers," *J. Am. Chem. Soc.*, 1995, vol. 117, No. 26 pp. 7017-7018.

[No Author Listed] Chemical Structure for Biphenylene. CAS No. 259-79-0. Downloaded Dec. 12, 2005.

Albert et al., Designing optical sensor arrays with enhanced sensitivity for explosives detection. Proceeedings of the SPIE—The International Society for Optical Engineering. Orlando, Florida. Apr. 13-17, 1998;3392(1-2):426-31. Abstract Only.

Amara, J. et al., "Incorporation of Internal Free Volume: Synthesis and Characterization of Iptycene-Elaborated Poly(butadiene)s," Macromolecules 2004, 37, 3068-3070.

Arias-Marin et al., Amphiphilic Phenyl-Ethynylene Polymers and Copolymers. Synthesis, Characterization, and Optical Emission Properties. Macromolecules. 2003;36:3570-79.

Armengaud et al., "Electrochemistray of conducting polypyrrole films containing cobalt porphyrin," J. Electroanal. Chem., 1990, 277:197-211.

Audebert et al., "Description of New Redox and Conducting Polymers Based on Copper Containing Units; Emphasis on the Role of Copper in the Electron Transfer Mechanism," Synthetic Metals, 1991, 3049-3052.

Audebert et al., "Redox and Conducting Polymers Based on Salen-Type Metal Units; Electrochemical Study and Some Characteristics," New Journal of Chemistry, 1992 16(6):697-703.

Audebert et al., "Synthesis and Characteristics of New Redox Polymers Based on Copper Containing Units; Evidence for the Participation of Copper in the Electron Transfer Mechanism," New Journal of Chemistry, 1991, 15(4):235-237.

Baldo et al., "Excitonic singlet-triplet ratio in a seminconducting organic thin film," Phys. Rev. B., 1999, 60(20), 14422-14428.

Baldo et al., "High-efficiency fluorescent organic light-emitting devices using a phosphorescent sensitizer," Nature, 2000, 403, 750-753.

Barigelletti et al., "Temperature Dependence of the Luminescence of Cyclometalated Palladium(II), Rhodium(III), Platinum(II), and Platinum(IV) Complexes," Inorg. Chem. 1988, 27, 3644-47.

Bedioui et al., "Electrochemistry of conducting polypyrrole films containing cobalt porphyrin, Part 2. New Developments and inclusion of metallic aggregates in the coordination polymer," J. Electroanal. Chem., 1991, 297:257-269.

Bedioui et al., "Electrooxidative polymerization of cobalt, nickel and manganese salen complexes in acetonitrile solution," J. Electroanal. Chem., 1991, 301:267-274.

Bedioui et al., "Poly(Pyrrole-Manganese Tetraphenylporphyrin) film Electrodes in Acetonitrile Solution," J. Electroanal. Chem., 1988, 239:433-439.

Bettelheim et al., "Electrochemical Polymerization of Amino-, Pyrrole-, and Hydroxy-Substituted Tetraphenylporphyrins," Inorganic Chemistry, 1987, 26(7):1009-1017.

Bowyer et al., Electrochemical reduction of vicinal dinitro compounds. J Org Chem. 1988;53(22):5234-5239.

Bredas et al., "Electronic Structure of Poly(paraphenylene vinylene): Influence of Copolymerization and Derivatization on Light-Emitting Characteristics," Am. Chem. Scoc., Div. Polym. Chem., 1994, 35, 185-186.

Brooks et al., "Synthesis and Characterization of Phosophorescent Cyclometalated Platinum Complexes," Inorg. Chem., 2002, 41(12), 3055-3066.

Brown et al., "Core-referenced ratiometric fluorescent potassium ion sensors using self-assembled ultrathin films on europium nanoparticles," IEEE Sensors Journal, 2005, 5(6), 1197-1205.

Brown et al., Fluorescence-enhancement sensing of ammonia and hydrazines via disruption of the internal hydrogen bond in a carbazolopyridinophane. Sensors Actuators B. 2005;110:8-12.

Bustin, Absolute quantification of mRNA using real-time reverse transcription polymerase chain reaction assays. J Mol Endocrinol. Oct. 2000;25(2):169-93.

Cabarcos et al., "Effect of the Molecular Weight and the Ionic Strength on the Photoluminescence Quenching of Water-Soluble Conjugated Polymer Sodium Poly[2-(3-thienyl)ethyloxy-4-butylsulfonate]," Macromolecules, 2005, 38(25), 10537-10541.

Cameron et al., "A conjugated polymer/redox polymer hybrid with electronic communication between metal centres," Chem. Commun., 1997, 303-304.

Carrabba et al., Hydrogen bonding in the lowest singlet n-pi-star excited state of pyrimidine. J Phys Chem. 1985;89:674-77.

Chassot et al., "cis-Bis(2-phenylpyridine platinum(II)(CBPPP): A Simple Molecular Platinum Compound," Inorg. Chem., 1984, 23(25), 4249-4253.

Chassot et al., "Cyclometalated Complexes of Platinum(II): Homoleptic Compounds with Aromatic C,N Ligands," Inorg. Chem., 1987, 26(17), 2814-2818.

Chassot et al., "Photochemical Preparation of Luminsecent Platinum(IV) Complexes via Oxidative Addition on Luminescent Platinum(II) Complexes," J. Am. Chem. Soc., 1986, 108, 6084-6085.

Chatterjee et al.,Synthesis of Functionalized Olefins by Cross and Ring-Closing Metatheses. J Am Chem Soc. 2000;122(15):3783-84.

Choi et al, Oxygen-sensitive reverse-phase optode membrane using silica gel-absorbed ruthenium(II) complex embedded in gelatin film. Anal. Chim. Acta 1999, 387, 197-205.

Costa-Fernandez et al., "Sol-gel immobilized room-temperature phosphorescent metal-chelate as luminescent oxygen sensing material," *Anal. Chim. Acta.*, 1998, 360, 17-26.

Cumming et al., "Using Novel Fluorescent Polymers as Sensory Materials for Above-Ground Sensing of Chemical Signature Compounds Emanating from Buried Landmines," IEEE Transactions on Geoscience and Remote Sensing, 2001, 39:1119-1128.

Dahm et al., "Catalytic Reduction of Iodoethane and 2-Iodopropane at Carbon Electrodes Coated with Anodically Polymerized Films of Nickel(II) Salen," Analytical Chemistry, 1994, 66(19):3117-3123.

Dai et al., Sensors and sensor arrays based on conjugated polymers and carbon nanotubes. Pure Appl Chem. 2002;74(9):1753-72.

Davey et al., New Rigid Backbone Conjugated Organic Polymers with Large Fluorescence Quantum Yields. J Chem Soc Chem Commun. 1995;1433-34.

Decher, "Fuzzy Nanoassemblies: Toward Layered Polymeric Multicomposites," Science, 1997, 277(5330), 1232-1237.

Demchenko et al., "The problem of self-calibration of fluorescence signal in microscale sensor systems," Lab on a Chip, 2005, 5, 1210-1223.

Dijkstra et al., "Shape-Persistent Nanosize Organometallic Complexes: Synthesis and Application in a Nanofiltration Membrane Reactor," J. Org. Chem., 2003, vol. 68, No. 3, pp. 675-685.

Disney, M.D. et al., "Detection of Bacteria with Carbohydrate-Functionalized Fluorescent Polymers," J. Am. Chem. Soc. 2004, 126, 13343-13346.

Dougherty et al., "Photodynamic Therapy," J. Natl. Cancer Inst., 1998, 90(12), 889-905.

Dudek et al., Synthesis and energy-transfer properties of hydrogen-bonded oligofluorenes. J Am Chem Soc. Aug. 24, 2005;127(33):11763-8.

Dwight et al., "Perturbation of Fluorescence by Nonspecific Interactions between Anionic Poly(phenylenevinylene)s and Proteins: Implications for Biosensors," J. Am. Chem. Soc., 2004, 126(51), 16850-16859.

Ellis et al., Conductive Polymer Films as Ultrasensitive Chemical Sensors for Hydrazine and Monomethylhydrazine Vapor. Anal Chem. 1996;68:817-22.

Erdogan et al., Synthesis and mesoscopic order of a sugar-coated poly(p-phenyleneethynylene). Macromolecules. 2002;35:7863-64.

European Search Report for EP 02024311.9 mailed Jan. 3, 2003.

Ewing et al., Detection of volatile vapors emitted from explosives with a handheld ion mobility spectrometer. Field Anal Chem Technol. 2001;5:215-21.

Famulok et al., Nucleic acid aptamers-from selection in vitro to applications in vivo. Acc Chem Res. Sep. 2000;33(9):591-9.

Funhoff et al., Cationic polymethacrylates with covalently linked membrane destabilizing peptides as gene delivery vectors. J Control Release. Jan. 3, 2005;101(1-3):233-46.

Garner, C., et al., "Challenges for dielectric materials in future integrated circuit technologies," Microelectronics Reliability 2005, 45, 919-924.

Gianini et al., "Chiral Cyclometalated Platinum(II) Complexes with Derivatives of Thienylpyridine as Ligands: Helical Distortion of the Square Planar (SP-4) Geometry," Inorg. Chem, 1997, 36(26), 6094-6098.

Gianini et al., "Square Planar (SP-4) and Octahedral (OC-6) Complexes of Platinum (II) and—(IV) with Predetermined Chirality at the Metal Center," Inorg. Chem., 1996, 35(17), 4889-4895.

Goldsby et al., "Oxidation of Nickel(II) Bis(salicylaldimine) Complexes: Solvent Control of the Ultimate Redox Site," Polyhedron, 1989, 8(1):113-115.

Goldsby et al., "Symmetric and Unsymmetric Nickel(II) Schiff Base Complexes; Metal-Localized Versus Ligand-Localized Oxidation," J. Coord. Chem., 1988, 19:83-90.

Guice et al., "Nanoscale internally referenced oxygen sensors produced from self-assembled nanofilms on fluorescent nanoparticles," Journal of Biomedical Optics, 2005, 10(6), 064031-1-064031-10.

Guimaraes et al., On the fluoresence of pyrole derviative oligomer. Mater Sci Engineer C. 2008;28:1076-81.

Hard et al., Fluorescence studies of a single tyrosine in a type II DNA binding protein. Biochemistry. Jan. 10, 1989;28(1):396-406.

Havemann, R., "High-Performance Interconnects: An Integration Overview," Proceedings of the IEEE 2001, 89(5), 586-601.

Hill et al., "A Mechanistic Study of the Photochemically Initiated Oxidative Addition of Isopropyl Iodide to Dimethl(1,10-phenanthroline)platinum(II),"J. Am. Chem. Soc., 1985, 107(5), 1218-1225.

Hoferkamp et al., "Surface-Modified Electrodes Based on Nickel(II) and Copper(II) Bis(salicylaldimine) Complexes," Chemistry of Materials, 1989, 1(3):348-352.

Horwitz et al., "Oxidative Electropolymerization of Metal Schiff-Base Complexes," Mol. Cryst. Liq. Cryst., 1988, 160:389-404.

Houk et al., "[C-H•••O] Interactions as a Control Element in Supramolecular Complexes: Experimental and Theoretical Evaluation of Receptor Affinities for the Binding of Bipyridinium-Based Guests by Catenated Hosts," J. Am. Chem. Soc., 1999, 121(7),1479-1487.

Houser et al.. Rational materials design of sorbent coatings for explosives: applications with chemical sensors. Talanta. May 10, 2001;54(3):469-85.

Huang et al., "Design of a Modular-Based Fluorescent Conjugated Polymer for Selective Sensing," Angew. Chem. Int. Ed., 2004, 43(42), 5635-5638.

Huang et al., Nanostructured polyaniline sensors. Chemistry. Mar. 19, 2004;10(6):1314-9.

International Search Report and Written Opinion mailed Feb. 23, 2006, PCT/US2005/033261.

International Preliminary Report on Patentability for PCT/US2005/033261 mailed Mar. 29, 2007.

Invitation to Pay Additional Fees for PCT/US2006/045390 mailed Jun. 12, 2007.

International Search Report and Written Opinion for PCT/US2006/045390 mailed Sep. 24, 2007.

International Preliminary Report on Patentability for PCT/US2006/045390 mailed Jun. 5, 2008.

Invitation to Pay Additional Fee for PCT/US2007/017380 mailed Jan. 4, 2008.

International Search Report and Written Opinion mailed Apr. 8, 2008 in PCT/US2007/017380.

International Preliminary Report on Patentability mailed Nov. 10, 2008 in PCT/US2007/017380.

International Search Report and Written Opinion mailed Dec. 14, 2007 in PCT/US2007/020961.

International Preliminary Report on Patentability dated Mar. 31, 2009, mailed Apr. 9, 2009, in PCT/US2007/020961.

Invitation to Pay Additional Fee for PCT/US2007/020992 mailed Feb. 8, 2008.

International Search Report and Written Opinion for PCT/US2007/020992 mailed Apr. 4, 2008.

International Preliminary Report on Patentability for PCT/US2007/020992 mailed Apr. 9, 2009.

International Search Report and Written Opinion mailed Oct. 27, 2008 in PCT/US2007/022670.

International Preliminary Report on Patentability dated Apr. 28, 2009, mailed May 7, 2009, in PCT/US2007/022670.

Invitation to Pay Additional Fee for PCT/US2007/021370 mailed Feb. 22, 2008.

International Search Report and Written Opinion mailed Jun. 13, 2008 in PCT/US2007/021370.

International Preliminary Report on Patentability for PCT/US2007/021370 mailed Apr. 16, 2009.

Jayarajah et al., "Oxygen Diffusion and Permeability in Alkylaminothionylphosphazene Films Intended for Phosphorescence Barometry Applications," Macromolecules, 2000, 33(15), 5693-5701.

Jensen et al., Cytoplasmic delivery and nuclear targeting of synthetic macromolecules. J Control Release. Feb. 21, 2003;87(1-3):89-105.

Jolliet et al., "Cyclometalated Complexes of Palladium(II) and Platinum(II): cis-Configured Homoleptic and Heteroleptic Compounds with Aromatic C∧N Ligands," Inorg. Chem., 1996, 35(17), 4883-4888.

Joly et al., "Highly Effective Water-Soluble Fluorescence Quenchers of Conjugated Polymer Thin Films in Aqueous Environments," Macromolecules, 2006, 39(21), 7175-7177.

Katayama et al., Vinylideneruthenium complexes in catalysis. Coord Chem Revs. 2004;248:1703-15.

Kim et al. "Nonspecific Interactions of a Carboxylate-Substituted PPE with Proteins. A Cautionary Tale for Biosensor Applications," Langmuir, 2005, 21(17), 7985-7989.

Kui et al., "Structures, Photoluminescence, and Reversible Vapoluminescence Properties of Neutral Platinum(II) Complexes Containing Extended p-Conjugated Cyclometalated Ligands," J. Am. Chem. Soc. 2006, 128, 8297-309.

Lamansky et al., "Highly Phosphorescent Bis-Cyclometalated Iridium Complexes: Synthesis, Photophysical Characterization, and Use in Organic Light Emitting Diodes," J. Am. Chem. Soc., 2001, 123(18), 4304-4312.

Lamba et al., "Imine-Bridged Planar Poly(p-phenylene) Derivatives for Maximization of Extended π-Conjugation. The Common Intermediate Approach," J. Am. Chem. Soc., 1994, 116(26), 11723-11736.

Li et al., Water-Soluble Poly(acrylic acid) Grafted Luminescent Silicon Nanoparticles and Their Use as Fluorescent Biological Staining Labels. Nano Letters. 2004; 4(8):1463-1467.

Liao et al., "Quantification of Amplified Quenching for Conjugated Polymer Microsphere Systems," Langmuir, 2007, 23(1), 112-115.

Lim et al., Transferrin-oligomers as potential carriers in anticancer drug delivery. Pharm Res. Nov. 2004;21(11):1985-92.

Lipkowitz et al., A protocol for determining enantioselective binding of chiral analytes on chiral chromatographic surfaces. J Am Chem Soc. 1988;110:3446-52.

Liu et al., "Fluorescence Quenching Mechanism of a Polyphenylene Polyelectrolyte with Other Macromolecules: Cytochrome c and Dendrimers," Langmuir, 2005, 21(5), 1687-1690.

Liu et al., "Effect of Chromophore-Charge Distance on the Energy Transfer Properties of Water-Soluble Conjugated Oligomers," *J. Am. Chem. Soc.*, vol. 125, pp. 6705-6714 (2003).

Long, T. et al., "Molecular Design of Free Volume as a Route to Low-κ Dielectric Materials," J. Am. Chem. Soc. 2003, 125, 14113-14119.

MacDiarmid, Polyanaline and polypyrrole: Where are we headed? Synthetic Metals. 1997;84:27-34.

Maestri et al., "Absorption Spectra and Luminescence Properties of Isomeric Platinum(II) and Palladium(II) Complexes Containing 1,1'-Biphenyldiyl, 2-Phenylpyridine, and 2, 2'-Bipyridine as Ligands," Helvetica Chimica Acta 1988, 71, 1053-59.

Maex, K. et al., "Low dielectric constant materials for microelectronics," Journal of Applied Physics 2003, 93(11), 8793-841.

Maier, G., "Low dielectric constant polymers for microelectronics," Prog. Polym. Sci. 2001, 26, 3-65.

Mañes et al., Extraction-spectrophotometric determination of hydrazine with 2-hydroxy-1-naphthaldehyde. Analyst. 1987;112:1183-84.

Martin, S. et al., "Development of a Low-Dielectric-Constant Polymer for the Fabrication of Integrated Circuit Interconnect," Adv. Mater. 2000, 12(23), 1769-78.

Matloka et al., The acyclic diene metatheis (ADMET) polymerization approach to silicon containing materials. J Mol Catalysis. 2006;257:89-98.

Medintz et al., "Quantum dot bioconjugates for imaging, labelling and sensing," Nature Materials, 2005, 4(6), 435-446.

Moon et al., Live-cell-permeable poly(p-phenylene ethynylene). Angew Chem Int Ed Engl. 2007;46(43):8223-5.

Morgen, M., et al., "Low Dielectric Constant Materials for ULSI Interconnects," Annu. Rev. Mater. Sci. 2000, 30, 645-80.

Morin et al., "Syntheses of Conjugated Polymers Derived from N-Alkyl-2,7-carbazoles," Macromolecules, 2001, 34(14), 4680-4682.

Moroni et al., Rigid Rod Conjugated Polymers for Nonlinear Optics. 3. Intramolecular H Bond Effects on Poly(phenyleneethynylene) Chains. Macromolecules. 1997;30:1964-72.

Murarka, S., "Materials aspects of copper interconnection technology for semiconductor applications," Materials Science and Technology 2001, 17, 749-58.

Ng et al., Syntheses and characterisation of electrically conductive and fluorescent poly[3-ω-bromoalkyl)thiophenes]. Synthetic Metals. 1999;100:269-77.

Nie et al., "Immobilization of polydiacetylene onto silica microbeads for colorimetric detection," J. Mater. Chem., 2006, 16, 546-549.

Norvez, S., et al., "Epitaxygens: mesomorphic properties of triptycene derivatives," Liquid Chemicals, 1993, vol. 14, No. 5, pp. 1389-1395.

Office Action from U.S. Appl. No. 11/252,419 dated Mar. 13, 2008.
Office Action from U.S. Appl. No. 11/252,419 dated Dec. 12, 2008.
Office Action from U.S. Appl. No. 11/252,419 dated Jun. 12, 2009.
Okamoto, I. et al., "Orbital Unsymmetrization Affects Facial Selectivities of Diels-Alder Dienophiles," J. Org. Chem. 1996, 61, 3155-3166.
Ortege-Barrales et al., Solid-phase spectrophotometric determination of trace amounts of hydrazine at sub-ng ml-1 level. Anal Chim Acta. 1997;353:115-22.
Orynbayeva et al., Visualization of membrane processes in living cells by surface-attached chromatic polymer patches. Angew Chem Int Ed Engl. Feb. 4, 2005;44(7):1092-6.
Osborne et al., Nucleic Acid Selection and the Challenge of Combinatorial Chemistry. Chem Rev. Apr. 1, 1997;97(2):349-370.
Ow et al., "Bright and stable core-shell fluorescent silica nanoparticles," Nano Letters, 2005, 5(1), 113-117.
Park et al., "Ratiometric Optical PEBBLE Nanosensors for Real-Time Magnesium Ion Concentrations Inside Viable Cells," Anal. Chem., 2003, 75(15), 3784-3791.
Pei et al., First Hydrogen-Bonding-Induced Self-Assembled Aggregates of a Polyfluorene Derivative. Macromolecules. 2003;36:323-27.
Pei et al., Polymer Light-Emitting Electrochemical Cells: In Situ Formation of a Light-Emitting p-n Junction. J Am Chem Soc. 1996;118(16):3922-3929.
Perr et al., Solid phase microextraction ion mobility spectrometer interface for explosive and taggant detection. J Sep Sci. Feb. 2005;28(2):177-83.
Pingarron et al., Carbon fibre microelectrodes modified with rhodium for the electrocatalytic determination of hydrazine. Anal Chim Acta. 2001;439:281-90.
Pisarevskii et al., Fluoresence spectrum and quantum yield of DNA in solution. Zhurnal Prikladnoi Spektroskipii. 1966;5:621-24.
Ratcliffe, Polypyrrole-based sensor for hydrazine and ammonia. Anal Chim Acta. 1990;239:257-62.
Reddinger et al., "Electroactive π-Conjugated Polymers Based on Transition Metal-Containing Thiophenes Capable of Sensing Ionic and Neutral Species," ACS Polym. Prepr., 1997, 321-322.
Reddinger et al., "Electroactive π-Conjugated Polymers Based on Transition Metal-Containing Thiophenes," Synthetic Metals, 1997, 84:225-226.
Reddinger et al., "Tunable Redox and Optical Properties Using Transition Metal-Complexed Polythiophenes," Macromolecules, 1997, 30(3):673-675.
Rendina et al., "Oxidative Addition Reactions of Organplatinum (II) Complexes with Nitrogen-Donor Donor Ligands," J. Chem. Rev. 1997, 1735-54.
Rose et al., "Excited-State Lifetime Modulation in Triphenylene-Based Conjugated Polymers," J. Am. Chem. Soc., 2001, 123:11298-11299.
Rose et al., Sensitivity gains in chemosensing by lasing action in organic polymers. Nature. Apr. 14, 2005;434(7035):876-9.
Sandrini et al., "Photochemistry of the Orthometalated cis-Bis[2-(2-thienyl)pyridine]platinum(II) Complex in Halocarbon Solvents," J. Am. Chem. Soc. 1987, 109, 7720-24.
Schwarz et al., "Spectroscopic Studies of Cyclometalated Platinum(II) Complexes: Optical Absorption and Emission of Single-Crystal cis-Bis(benzo[h]quinolinato)platinum(II)," Inorg. Chem. 1989, 28, 1053-59.
Segawa et al., "Approaches to conducting polymer devices with nano-structure: Electrochemical construction of one-dimensional and two-dimensional prophyrin-oligothiophene co=polymers," Synthetic Metals, 1995, 71:2151-2154.
Shabani et al., Indirect Spectrophotometric Determination of Trace Quantities of Hydrazine. Bull Korean Chem Soc. 2004;25:213-15.
Shamiryan, D. et al., "Low-k dielectric materials," Materials Today, Jan. 2004. 34-39.
Shimidzu et al., "Approaches to conducting polymer devices with nanostructures: photoelectrochemical function of one-dimensional and two-dimensional porphyrin polymers with oligothienyl molecular wire," Journal of Photochemistry and Photobiology A: Chemistry 99, 1995, Article 4168:1-7.

Smet, M. et al., "Synthesis of the Formal Diels-Alder Adducts of N-substituted Dehydromaleimides and Anthracene," Molecules 2000, 5, 179-188.
Thomas, III et al. "Designing Amplifying Polymer Sensors for Explosives and Toxic Chemicals," Polymeric Materials: Science and Engineering 2006, 95, 81-82.
Thomas, III et al., "Dark-Field Oxidative Addition-Based Chemosensing: New Bis-clyclometalated Pt(II) Complexes and Phosphorescent Detection of Cyanogen Halides," J. Am. Chem. Soc. 2006, 128, 16641-16648.
Thomas, III et al., "Synthesis and Optical Properties of Simple Amine-Containing Conjugated Polymers," Macromolecules, 2005, 38(7), 2716-2721.
Toal et al., Polymer sensors for nitroaromatic explosives detection. J Mater Chem. 2006;16:2871-83.
Treichel, H. et al., "Integration Challenges for Low Dielectric Constant Materials," Advanced Engineering Materials. 2001;7(3):461-64.
Tsai et al., New Thiophene-Linked Conjugated Poly(azomethine)s: Theoretical Electronic Structure, Synthesis, and Properties. Macromolecules. 2005;38:1958-66.
Vilas-Boas et al., "New Insights into the Structire and Properties of Electroactive Polymer Films Derived from [Ni(salen)]," Inorganic Chemistry, 1997, 36(22):4919-4929.
Virji et al., Hydrazine Detection by Polyaniline Using Fluorinated Alcohol Additives. Chem Mater. 2005;17(5):1256-1260.
Virji et al., Polyaniline Nanofiber Gas Sensors: Examination of Response Mechanisms. Nano Letters. 2004;4(3):491-496.
Von Zelewsky et al., "Thermal and Photochemical Oxidative Addition of Alkyl Halides to the Cyclometalated Complex cis-Bis[2-(2'-thienyl)pyridine]platinum(II)," Inorg. Chem. 1993, 32, 4585-93.
Wang et al., Catalytic-adsorptive stripping voltammetric measurements of hydrazines. Talanta. Dec. 1988;35(12):965-8.
Wang et al., Hydrazine Detection Using a Tyrosinase-Based Inhibition Biosensor. Anal Chem. 1995;67:3824-27.
Willis et al., Fluoresence decay kinetics of tyrosinate and tyrosine hydrogen-bonded complexes. J Physical Chemistry 1991;95:1585-89.
Wolfbeis, "Materials for fluorescence-based optical chemical sensors," J. Mater. Chem., 2005, 15, 2657-2669.
Wosnick et al., "Layer-by-Layer Poly(phenylene ethynylene) Films on Silica Microspheres for Enhanced Sensory Amplification," Macromolecules, 2005, 38(22), 9287-9290.
Wosnick et al., "Synthesis and Application of Poly(phenylene Ethynylene)s for Bioconjugation: A Conjugated Polymer-Based Fluorogenic Probe for Proteases," J. Am. Chem. Soc., 2005, 127(10), 3400-3405.
Wu et al., "Preparation and Encapsulation of Highly Fluorescent Conjugated Polymer Nanoparticles," Langmuir, 2006, 22(7), 2956-2960.
Wu et al., Novel water-soluble fluorescent polymer containing recognition units: Synthesis and interactions with PC12 cell. Euro Polymer J. 2005;41:1985-1992.
Yamaguchi et al., Light-emitting efficiency tuning of rod-shaped pi conjugated systems by donor and acceptor groups. J Am Chem Soc. Jul. 6, 2005;127(26):9332-3.
Yang et al.,Growth of Ultrathin Covalently Attached Polymer Films: Uniform Thin Films for Chemical Microsensors. Langmuir. 1998;14:1505-07.
Yu et al., New efficient blue light emitting polymer for light emitting diodes. Chem Commun. 1999:1837-38.
Yuan et al., +Fiber optic chemical sensors using a modified conducting polymer cladding. SPIE. 2001;4205:170-79.
Zahn et al., "Three-Dimensional Electronic Delocalization in Chiral Conjugated Polymers," Angew. Chem. Int. Ed. Engl., 2002, 41(22):4226-4230.
Zheng et al., Fluorescent detection of chemical warfare agents: functional group specific ratiometric chemosensors. J Am Chem Soc. Mar. 26, 2003;125(12):3420-1.
Zhao et al., "Sensory Responses in Solution vs Solid State: A Fluorescence Quenching Study of Poly(iptycenebutadiynylene)s," Macromolecules, 2005, 38(22), 9377-9384.

Zheng et al., Biotinylated poly(p-phenylene ethynylene): unexpected energy transfer results in the detection of biological analytes. Chem Commun (Camb). Dec. 21, 2004;(24):2798-9. Epub Nov. 4, 2004.

Zheng, J. et al., Supporting Information for "Energy Transfer from Biotinylated Poly)p-phenylene ethynylene): New Insights for Amplified Fluorescence-Based Biosensors" [Chem. Commun., 2004, 2798-2799).

Zhou et al., Novel Polyphenylenes Containing Phenol-Substituted Oxadiazole Moieties as Fluorescent Chemosensors for Fluoride Ion. Macromolecules. 2005;38:2148-53.

Zhu et al., "Conducting Polymetallorotaxanes: A Supramolecular Approach to Transition Metal Ion Sensors," Journal of the American Chemical Society, 1996, 118(36):8713-8714.

Zhu et al., "Design of Conducting Redox Polymers: A Polythiophene-Ru(bipy)3n Hybrid Material," Adv. Mater., 1996, 8(6):497-500.

Zotti et al., "Conductivity in Redox Modified Conducting Polymers. 2. Enhanced Redox Conductivity in Ferrocene-Substituted Polypyrroles and Polythiophenes," Chem. Mater., 1995 7(12):2309-2315.

* cited by examiner

Y = H, Si*t*-BuMe₂

91 (NON-FLUORESCENT) → 92 (FLUORESCENT)

EMISSIVE SENSORS AND DEVICES INCORPORATING THESE SENSORS

RELATED APPLICATIONS

This application is continuation of U.S. patent application Ser. No. 10/823,093, filed Apr. 12, 2004, titled, "Emissive Sensors and Devices Incorporating These Sensors," by Timothy M. Swager et al., which application is a continuation-in-part of U.S. patent application Ser. No. 10/680,714, filed Oct. 7, 2003, titled "Emissive Sensors and Devices Incorporating These Sensors," by Timothy M. Swager et al., now abandoned, which application is a continuation-in-part of U.S. patent application Ser. No. 10/324,064, filed Dec. 18, 2002, entitled "Emissive Polymers and Devices Incorporating These Polymers," by Timothy M. Swager et al., now U.S. Pat. No. 7,208,122, which application is a continuation of U.S. patent application Ser. No. 09/305,379, filed May 5, 1999, entitled "Emissive Polymers and Devices Incorporating These Polymers," by Timothy M. Swager et al., now abandoned, which application claims the benefit of U.S. Provisional Application Ser. No. 60/084,247, filed May 5, 1998, entitled "Shape Persistent Polymers with High Fluorescence and Stability," by Timothy M. Swager et al. All of these applications are incorporated herein by reference.

FEDERALLY SPONSORED RESEARCH

This invention was made with government support under Grant Number DE-FG07-01ID14222, awarded by the Department of Energy, and under Grant No. DAAD19-011-0676, awarded by the Army Research Office. The government has certain rights in this invention.

FIELD OF THE INVENTION

The present invention relates to luminescent and optically absorbing compositions, including solid films incorporating these compositions, exhibiting increased luminescent lifetimes, quantum yields and/or amplified emissions. The present invention also relates to a sensor and a method for sensing an analyte through the luminescent and optically absorbing properties of those compositions and/or precursors of those compositions.

BACKGROUND OF THE INVENTION

Chemical sensors are devices that detect the presence and/or level of a particular chemical species (an "analyte") in the air, water, or another medium. There is a high demand for chemical sensor devices able to detect low concentration levels of analytes in the liquid and/or gaseous phases. Specificity to particular analytes (the ability of a sensor to distinguish one species from another) is also generally desired.

Chemical sensor devices often involve luminescent materials because luminescence lifetimes and intensities can be sensitive to the presence of an external analyte. A typical sensor of this type includes a binding site where an analyte binds to a composition or precursor on the sensor, and this binding affects the intensity and/or wavelength of luminescence of a luminescent material in the sensor in a manner that is observable. Fluorescent materials are one class of luminescent materials that are particularly useful for sensor devices because their fluorescence and/or other physical properties can be optimized and/or tailored for particular analytes through chemical structure changes of the material, i.e., their sensitivity to a particular analyte can be controlled. Fluorescent materials are able to fluoresce in some cases because they are capable of delocalizing electronic charge throughout a substantial portion of the material through electron pi-conjugation, via a pi-conjugated portion comprising a set of orbitals that can function as a valence band. The energy difference between the valence band and non-valence or conduction bands of the material is generally referred to as a "band gap," and energy transitions of electrons between these levels can cause fluorescence. Other energy levels of the material may also be available in the band gap or in higher energy levels having antibonding character.

Because electronic charge delocalization through pi-conjugation of fluorescent materials results in the formation of various elevated energy levels, a variety of excited state structures are available upon absorption of external excitation energy by the fluorescent material. The luminescence yields of these excited state structures generally depends on the structure. The luminescence of some materials can be "quenched" by the presence of an analyte capable of absorbing the excitation energy contained by the material, resulting in the material returning to a ground state without causing luminescence. The analyte can be externally or internally located within the material. One example of such quenching is through a pi-stacking mechanism. In a pi-stacking mechanism, atoms involved in pi-conjugation can be positioned on top of other moieties having geometrically accessible pi-orbitals, thereby forming a pathway for energy transfer that allows quenching to occur.

SUMMARY OF THE INVENTION

The present invention generally relates to compositions and/or precursors of those compositions capable of emitting radiation and exhibiting increased luminescent lifetimes and/or quantum yields. The subject matter of this invention involves, in some cases, interrelated products, alternative solutions to a particular problem, and/or a plurality of different uses of a single system or article.

In one aspect, the invention is a composition. The composition, in one set of embodiments, includes a compound able to react with an agent having a structure:

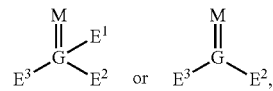

where G is an electrophilic atom, at least one E in the structure is electron-withdrawing, and M is a chalcogen or NR, R being an alkyl, to produce a product having greater emissivity than the compound. In some cases, the product may comprise at least a portion of the compound that has been cyclized upon reaction with the agent.

In another set of embodiments, the composition includes a compound having a structure:

where

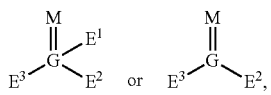

comprises an organic moiety, Q̈ is one of nitrogen or oxygen, and Y is one of H or $SiR_3$, each R independently being one of hydrogen and an organic moiety. In one embodiment, at least a portion of the compound is able to cyclize upon reaction of the compound with an electrophile able to transform OY into an alkylating agent. In another embodiment, the compound is able to react with a species having a structure:

$$\underset{E^3}{\overset{M}{\underset{\|}{G}}}\underset{E^2}{\overset{E^1}{\diagup}} \quad or \quad \underset{E^3}{\overset{M}{\underset{\|}{G}}}\diagdown E^2,$$

where G is an electrophilic atom, at least one E in the structure is electron-withdrawing, and M is a chalcogen or NR, R being an alkyl, to produce a product having a structure E-OY.

The composition includes, in yet another set of embodiments, a compound able to react with an agent comprising an electrophilic phosphorous, sulfur, or arsenic atom to produce a product having greater emissivity than the compound, where the product includes at least a portion of the compound that has been cyclized upon reaction with the electrophilic phosphorous, sulfur, or arsenic atom. In another set of embodiments, the composition includes a compound able to react with an agent comprising electrophilic phosphorous, sulfur, or arsenic atom to produce a product having a smaller band gap than the compound, where the product includes at least a portion of the compound that has been cyclized upon reaction with the electrophilic phosphorous, sulfur, or arsenic atom. In still another set of embodiments, the composition includes a substantially non-emissive compound able to react with an electrophile to produce an emissive compound.

The composition, in accordance with one set of embodiments, includes a compound having at least two conjugated groups connected by a single covalent bond, where the conjugated groups are able to rotate about the single covalent bond independently of each other, and where the conjugated groups are not in substantial pi-conjugation with each other. In some cases, the compound is able to react with an electrophile to produce a product in which the two conjugated groups are connected such that the ability of the two conjugated groups to rotate independently of each other is diminished.

In another set of embodiments, the composition includes a compound having a structure:

$Cj^1-Cj^2-OY$, where $Cj^1$ and $Cj^2$ each independently are conjugated groups not in substantial pi-conjugation with each other, and Y is one of H or $SiR_3$, each R independently being one of hydrogen and an organic moiety. In one embodiment, the compound is able to react with an electrophile such that $Cj^1$ and $Cj^2$ become substantially pi-conjugated with each other. The compound, in another embodiment, is able to react with an electrophile comprising an electron-withdrawing substituent E to produce a product having a structure E-OY.

The composition, in yet another set of embodiments, includes a polymer having a structure:

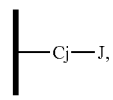

where | is a substantially pi-conjugated polymer backbone, Cj is non-existent or comprises at least one conjugated group, and J is a moiety not substantially pi-conjugated with |. In one embodiment, J is able to react with an electrophile such that J becomes substantially pi-conjugated with at least one of | and Cj, if present, upon reaction with the electrophile. In another embodiment, the polymer may have an emissivity that is altered upon reaction of J with an electrophile.

In accordance with another set of embodiments, the composition may include a sensor comprising a compound reactive with an electrophile. The compound, in certain cases, is able to react with the electrophile to form a non-preexisting product having increased conjugation relative to any compound involved in the reaction.

According to another set of embodiments, the compound has a structure A-OY, where A comprises an organic moiety, and Y is one of H or $SiR_3$, each R independently being one of hydrogen and an organic moiety. In certain embodiments, the compound is able to react with a structure G-E, G being an electrophilic moiety and E being electron-withdrawing, to produce at least a first product that is cyclic and a second product having a structure E-OY.

The composition, in still another set of embodiments, includes a compound able to react with an electrophile to produce a product having a structure:

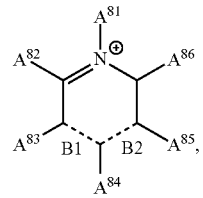

where at least one or more of $A^{81}$, $A^{82}$, $A^{83}$, $A^{84}$, $A^{85}$, and $A^{86}$ comprises at least one conjugated group, and each of B1 and B2 is a single bond or a double bond such that B1 and B2 both are not double bonds. The composition, in accordance with yet another set of embodiments, includes a compound able to react with an electrophile to produce a product having a structure:

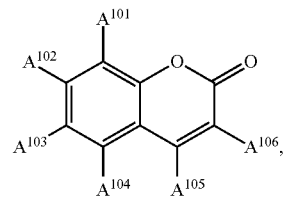

where at least one or more of $A^{101}$, $A^{102}$, $A^{103}$, $A^{104}$, $A^{105}$, and $A^{106}$ is one of hydrogen or an organic moiety.

The composition, in still another set of embodiments, includes a compound having a structure:

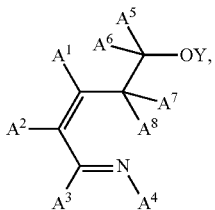

where Y is one of H or SiR$_3$, each R independently being one of hydrogen and an organic moiety. At least one or more of A$^1$, A$^2$, A$^3$, A$^4$, A$^5$, A$^6$, A$^7$, and A$^8$ includes at least one conjugated group. In some cases, the compound is able to react with an electrophile such that OY leaves the compound.

In one set of embodiments, the composition includes a compound having a structure EP-ER-OY, where EP includes an electron-poor moiety relative to ER, ER includes an electron-rich moiety relative to EP, and Y is one of H or SiR$_3$, each R independently being one of hydrogen and an organic moiety. The compound, in one embodiment, is able to react with an electrophile to produce a product having greater emissivity than the compound. The compound, in another embodiment, is able to react with an electrophile to produce a product having a quantum yield of at least about 30%.

In another aspect, the invention is a method. The method, in accordance with one set of embodiments, includes reacting a compound with an electrophile to produce a product having a greater emissivity than the compound, where the product includes at least a portion of the compound that has been cyclized upon reaction with the electrophile. In accordance with another set of embodiments, the method includes reacting a compound with an electrophile to produce a product having a smaller band gap than the compound, where the product comprises at least a portion of the compound that has been cyclized upon reaction with the electrophile.

In another set of embodiments, the method includes reacting a compound having at least two conjugated groups connected by a single covalent bond, the conjugated groups being not in substantial pi-conjugation with each other and thereby being able to rotate about the single covalent bond independently of each other, with an electrophile to produce a product in which the two conjugated groups are connected such that the ability of the two conjugated groups to rotate independently of each other is diminished. The method, in yet another set of embodiments, includes reacting a substantially non-emissive compound with an electrophile to produce an emissive compound.

The method, according to still another set of embodiments, is defined, at least in part, by cyclizing at least a portion of a compound by reacting the compound with an electrophile, where the compound having a structure:

where

comprises an organic moiety, Q̈ is one of nitrogen or oxygen, and Y is one of H, an alkyl group, an alkoxy group, and SiR$_3$, where each R independently is one of hydrogen and an organic moiety.

The method, in another set of embodiments, comprises reacting a compound having a structure:

where

comprising an organic moiety, Q̈ is one of nitrogen or oxygen, and Y is one of H, an alkyl group, an alkoxy group, and SiR$_3$, each R independently being one of hydrogen and an organic moiety, a species having a structure:

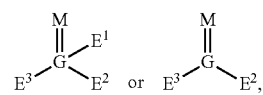

where G is an electrophilic atom, at least one E in the structure is electron-withdrawing, and M is a chalcogen or NR, R being an alkyl, to produce a product having a structure E-OY.

According to another set of embodiments, the method includes reacting a compound having a structure:

Cj$^1$-Cj$^2$-OY, where Cj$^1$ and Cj$^2$ each independently are conjugated groups not in substantial pi-conjugation with each other, and Y is one of H, an alkyl group, an alkoxy group, and SiR$_3$, each R independently being one of hydrogen and an organic moiety, with an electrophile such that Cj$^1$ and Cj$^2$ become substantially pi-conjugated with each other. The method, in yet another set of embodiments, includes reacting a compound having a structure:

Cj$^1$-Cj$^2$-OY, where Cj$^1$ and Cj$^2$ each independently are conjugated groups not in substantial pi-conjugation with each other, and Y is one of H, an alkyl group, an alkoxy group, and SiR$_3$, each R independently being one of hydrogen and an organic moiety, with an electrophile comprising an electron-withdrawing substituent E to produce a product having a structure E-OY.

In yet another set of embodiments, the method includes reacting a compound with an electrophile to produce a product having a structure:

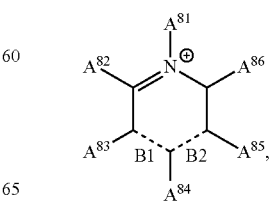

where at least one or more of $A^{81}, A^{82}, A^{83}, A^{84}, A^{85}$, and $A^{86}$ comprise at least one conjugated group, and each of B1 and B2 is a single bond or a double bond such that B1 and B2 both are not double bonds. In still another set of embodiments, the method includes reacting a compound with an electrophile to produce a product having a structure:

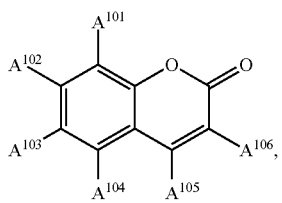

where at least one or more of $A^{101}, A^{102}, A^{103}, A^{104}, A^{105}$, and $A^{106}$ is one of hydrogen or an organic moiety.

According to another set of embodiments, the method comprises reacting a compound having a structure:

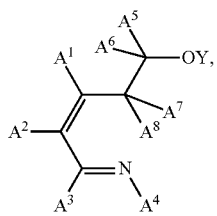

with an electrophile such that OY leaves the compound. In this structure, at least one or more of $A^1, A^2, A^3, A^4, A^5, A^6, A^7$, and $A^8$ comprises at least one conjugated group, and Y is one of H, an alkyl group, an alkoxy group, and $SiR_3$, each R independently being one of hydrogen and an organic moiety.

In another set of embodiments, the method includes reacting a compound having a structure A-OY, where A comprises an organic moiety and Y is one of H, an alkyl group, an alkoxy group, and $SiR_3$, each R independently being one of hydrogen and an organic moiety, with a structure G-E, G being an electrophilic moiety and E being electron-withdrawing, to produce at least a first product that is cyclic and a second product having a structure E-OY.

According to yet another set of embodiments, the method, comprises reacting a compound having a structure EP-ER-OY, where EP comprises an electron-poor moiety relative to ER, ER comprises an electron-rich moiety relative to EP, and Y is one of H, an alkyl group, an alkoxy group, and $SiR_3$, each R independently being one of hydrogen and an organic moiety, with an electrophile to produce a product having greater emissivity than the compound. The method, according to still another set of embodiments, comprises reacting a compound having a structure EP-ER-OY, where EP comprises an electron-poor moiety relative to ER, ER comprises an electron-rich moiety relative to EP, and Y is one of H, an alkyl group, an alkoxy group, and $SiR_3$, each R independently being one of hydrogen and an organic moiety, with an electrophile to produce a product having a quantum yield of at least about 40%.

The method, in another set of embodiments, includes providing a polymer having a structure:

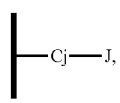

where | is a substantially pi-conjugated polymer backbone, Cj is non-existent or comprises at least one conjugated group, and J is a moiety not substantially pi-conjugated with |. In one embodiment, the method also includes reacting J with an electrophile such that J becomes substantially pi-conjugated with at least one of | and Cj, if present. In another embodiment, the method includes reacting J with an electrophile to alter an emissivity of the polymer.

The method, in one set of embodiments, can be defined, at least in part, by exposing a sensor comprising a compound reactive with an electrophile to a medium suspected of containing the electrophile. The method also can include, when the electrophile is present in the medium at least a detectable level, reacting the electrophile with the compound to form a non-preexisting product having increased conjugation relative to any compound involved in the reaction. The method further includes, in some cases, determining the increased conjugation thereby determining the electrophile in the medium.

Other advantages, novel features, and objects of the invention will become apparent from the following detailed description of the invention when considered in conjunction with the accompanying drawings, which are schematic and which are not intended to be drawn to scale. In the figures, each identical or nearly identical component that is illustrated in various figures is represented by a single numeral. For purposes of clarity, not every component is labeled in every figure, nor is every component of each embodiment of the invention shown where illustration is not necessary to allow those of ordinary skill in the art to understand the invention. In cases where the present specification and a document incorporated by reference include conflicting disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures.

DETAILED DESCRIPTION

Figure 1:
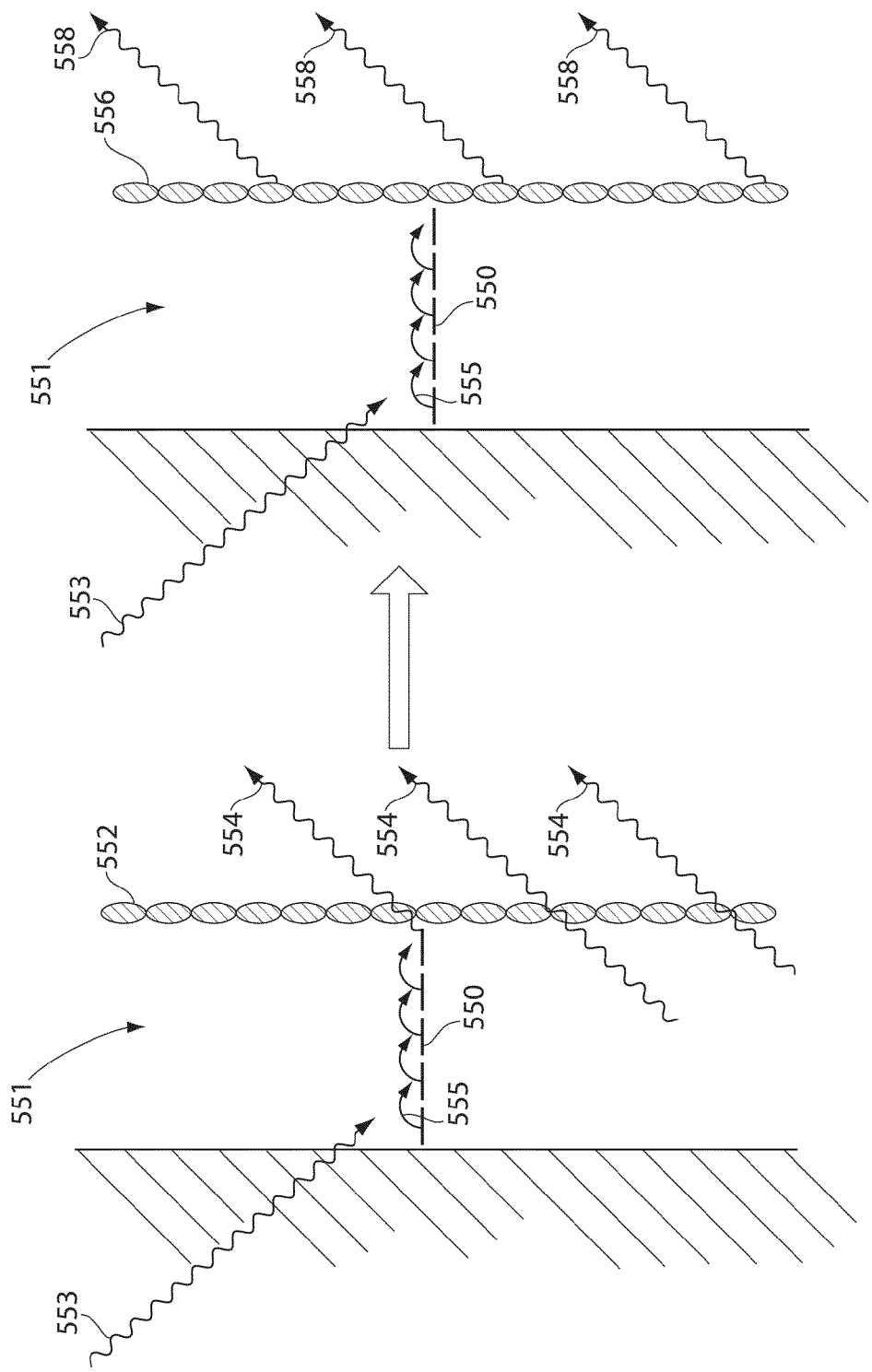
FIG. 1 shows a schematic of a film having a chromophore positioned on the surface of the film.

The present invention generally relates to luminescent and/or optically absorbing compositions and/or precursors to those compositions, including solid films incorporating these compositions/precursors, exhibiting increased luminescent lifetimes, quantum yields, enhanced stabilities and/or amplified emissions. The present invention also relates to sensors and methods for sensing analytes through luminescent and/or optically absorbing properties of these compositions and/or precursors. Examples of analytes detectable by the invention include, but are not limited to, electrophiles, alkylating agents, thionyl halides, and phosphate ester groups including phosphoryl halides, cyanides and thioates such as those found in certain chemical warfare agents. The present invention additionally relates to devices and methods for amplifying emissions, such as those produced using the above-described compositions and/or precursors, by incorporating the composition and/or precursor within a polymer having an energy migration pathway.

The following applications are incorporated herein by reference in their entirety: U.S. patent application Ser. No. 10/324,064, filed Dec. 18, 2002, entitled "Emissive Polymers and Devices Incorporating These Polymers," by Timothy M. Swager, et al.; U.S. patent application Ser. No. 09/305,379, filed May 5, 1999, entitled "Emissive Polymers and Devices Incorporating These Polymers," by Timothy M. Swager, et al.; and U.S. Provisional Patent Application Ser. No. 60/084,247, filed May 5, 1998, entitled "Shape Persistent Polymers with High Fluorescence and Stability," by Timothy M. Swager, et al.

In one aspect, the invention provides a sensor that is capable of detecting an analyte. As used herein, a "sensor" refers to any device or article capable of detecting the analyte, i.e., by producing a detectable signal (e.g., an enhanced optical or visual signal) upon interaction or reaction of the sensor or a component thereof with the analyte. For example, the sensor may include a composition and/or precursor able to react with an analyte that results in a detectable change in a physical characteristic of the composition or precursor, e.g., a change in emissivity or a change in band gap of the composition.

In some embodiments, the composition and/or precursor of the composition includes a chromophore. As used herein, a "chromophore" refers to a species or moiety capable of absorbing and/or emitting electromagnetic radiation, for example, through fluorescence emission or absorption. In some cases, the chromophore is capable of absorbing and/or emitting electromagnetic radiation in the UV and/or visible range, e.g., where the absorbed and/or emitted energy of the composition involves excited electronic states. A chromophore within or associated with the composition/precursor can have different functions. For example, a physical characteristic of the chromophore can be affected by an interaction of the composition with an analyte. This type of chromophore may be referred to as a "signaling chromophore" or a "reporter chromophore," which reports the interaction with the analyte as a change in the physical characteristic that can be detected or measured. A reporter chromophore may be bonded to the composition/precursor, the reporter chromophore may be an external molecule associated with the composition/precursor, etc. In some cases, the signaling chromophore in a precursor may not be detectable until the precursor has interacted with an analyte to form a composition. As used herein, a "precursor" is a compound that is capable of reacting with an analyte, but has not yet reacting with the analyte. A chromophore may also function to transport excitation energy to a portion of the composition/precursor and is referred to, in this instance, as a "transporter chromophore."

If the chromophore is or includes a conjugated group, the extent of delocalized bonding within the conjugated group may allow the existence of a number of accessible electronic excited states. If the conjugation of a composition containing the chromophore is sufficiently extensive so as to be able to produce a near continuum of excited states, the electronic excitations of the composition may involve a valence band, the highest fully occupied band, and a conduction band. The energy difference between the highest fully occupied band and the conduction band is typically referred to as the "band gap." In some cases, band gaps of the composition (or precursor) may be tailored and/or controlled by varying the molecular structure and/or providing different substituent groups within the composition or precursor, as is known to those of ordinary skill in the art.

In one set of embodiments of the invention, the chromophore is or includes a conjugated group. A "conjugated group," as used herein, refers to an interconnected chain of at least three atoms, each atom participating in delocalized pi-bonding. For example, the chain of three atoms may be a chain of three carbon atoms participating in delocalized pi-bonding, a chain of four or more carbon atoms participating in delocalized pi bonding, a ring of carbon atoms (optionally including nitrogen atoms or the like) participating in delocalized pi bonding, two carbon atoms and a nitrogen atom participating in delocalized pi bonding, etc. In some cases, the conjugated group includes at least one aromatic structure, for example, a benzene ring or a pyridine ring. As used herein, "aromatic" is given its ordinary definition as used in the field of organic chemistry. Other non-limiting examples of aromatic structures include naphthalene rings, anthracene rings, pyridine rings, quinoline rings, thiophene rings, furans, quinolizine rings, coumarins, iptycene moieties, etc. In some cases, the conjugated group may be schematically represented by structures such as:

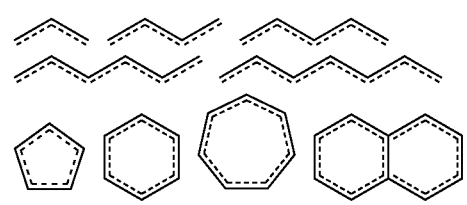

where the dotted lines within the molecular structures indicate delocalized pi-bonding between the atoms of the conjugated group (i.e., the presence of conjugated single/double bonds).

In a conjugated group, the electron density or electronic excitations can be transported along portions of the conjugated group where the electrons have been "delocalized." Each p-orbital participating in conjugation of a conjugated group may have sufficient overlap with adjacent conjugated p-orbitals, thus creating pi-conjugation. In one embodiment, the conjugated portion of the conjugated group is at least about 20 Å or 25 Å in length, and in some cases at least about 30 Å or 35 Å in length. Typically, atoms directly participating in pi-conjugation define a plane, the plane arising from a preferred arrangement of the p-orbitals to maximize p-orbital overlap, thus maximizing conjugation and electronic delocalization within the conjugated group. Thus, the composition and/or precursor may have at least one "plane" of conjugated atoms therein, and in some cases, two or more separate "planes" of conjugated atoms, i.e. if more than one conjugated group is present within the composition or precursor. In some cases, the composition or precursor has at least a first conjugated group and a second conjugated group not substantially pi-conjugated with the first conjugated group. In some cases, the two conjugated groups may be connected by a single bond, and/or be able to move or rotate independently of each other. As used herein, two conjugated groups that are "substantially pi-conjugated" have enough pi-conjugation between the two conjugated groups such that independent movement and/or rotation of the two conjugated groups with respect to each other is generally impeded by that conjugation. Conversely, when two conjugated groups are not substantially or "weakly" pi-conjugated, some pi-conjugation may exist between the two conjugated groups, but that pi-conjugation between the two conjugated groups is insufficient to prevent or restrain independent movement and/or rotation of the conjugated groups with respect to each other, for example, due to thermal or vibrational energy.

Another set of embodiments provides for the reduction of pi-stacking interactions in a composition or precursor of the invention, for instance through the formation of rigid groups or structures in the composition/precursor, for example in response to an interaction of the composition/analyte with an analyte. As used herein, "pi-stacking" refers to the cofacial interactions between pi-orbitals of two or more conjugated groups. For example, two benzene rings, a benzene ring and a double bond or a triple bond, two double bonds or two triple bonds, or the like may interact with each other in such a way as to cause pi-stacking of the two or more conjugated groups. In some cases, the creation of reduced pi-stacking within the composition from the precursor may result in increased quantum yields and/or luminescence lifetimes of the composition, relative to the precursor. These enhanced properties may be achieved in some cases when the composition is provided within a solid-state material, e.g., a film. A pi-stacking arrangement may facilitate energy transfer and/or increase the likelihood of quenching within the composition or precursor.

"Rigid groups," as used herein, refers to groups or structures that do not easily rotate about a bond axis. In one embodiment, the rigid group or structure rotates no more than about 180°, in some cases no more than about 120°, in some cases no more than about 60°, and in some cases no more than about 30° about a bond axis. In some cases, the rigid group or structure is prevented from any substantial rotation about the band axis. In one set of embodiments, a rigid structure may be caused by a chemical bond or structure that resists rotation, for example, a double bond or a triple bond, a cyclic structure, a benzene ring, an aromatic group, etc. In another set of embodiments, a rigid structure may be caused by steric interactions within a molecule or between molecules, for example, through large or bulky groups, such as t-butyl groups, iptycenes or tripytcenes, that are not generally able to freely rotate, for instance, due to interactions of such structures with other bulky groups. In yet another set of embodiments, a rigid group may be defined through the creation of a cyclic structure from an acyclic structure within the composition or precursor.

In some embodiments of the invention, two separate conjugated groups within a composition or precursor may not be in substantial pi-conjugation with each other, but upon reaction (or other interaction) of the composition or precursor with an analyte, conjugation between the two conjugated groups may be created and/or substantially enhanced, for example, in cases where the two conjugated groups can participate in delocalized pi-bonding with each other such that they can be considered to be a single conjugated group. In certain embodiments of the invention, the composition or precursor may include two or more conjugated groups able to move and/or rotate with respect to each other, where at least a portion of the composition/precursor becomes rigid after the composition/precursor has interacted with an analyte. In some cases, the two or more conjugated groups may be prevented from being able to move and/or rotate with respect to each other after interaction of the composition/precursor with the analyte. A rigid composition or precursor (or a portion thereof) may be sufficiently rigid such that the composition or precursor is able to remain luminescent or optically absorbing (or potentially luminescent and/or optically absorbing) despite alterations in the surrounding environment. For instance, in some embodiments, the rigid composition or precursor is rigid to the extent that the bond arrangement or connectivity of the composition or precursor does not substantially change over time, e.g., upon exposure to a solvent or upon heating to a temperature of no more than 100° C. or 150° C. (of course, characteristics such as the vibrational energy of the composition or precursor may be altered upon exposure to heat energy). In certain instances, an optical characteristic of the composition or precursor, such as the luminescence, and/or the optical absorption of the composition or precursor, does not substantially change more than about 20%, more than about 10%, or more than about 5%, with respect to time, e.g., upon exposure to a solvent or upon heating. That is, the rigidity of the composition or precursor is not affected by external conditions. In some cases, the exposure of the composition or precursor to a solvent or heating, without affecting rigidity, occurs over a period of time of about 5 min, preferably over a period of time of about 10 min, more preferably about 15 min, more preferably about 30 min, and more preferably still about 1 h or more. As an example of rigidity, a composition or precursor may be characterized by a first optical spectrum having at least one maximum or maxima. The composition/precursor is then exposed to a solvent or heated to a temperature of less than about 150° C. and a second optical spectrum is obtained. A maximum or maxima in the first spectrum may differ by no more than about 15 nm from a corresponding maximum or maxima in the second spectrum, and, in some cases, the maxima between the spectra may differ by no more than about 10 nm or no more than about 5 nm. In some cases, the maxima in the second spectrum may have an intensity change of less than about 10%, relative to the maxima in the first spectrum, and in some instances the intensity change is less than about 20%, less than about 15% or less than about 10% relative to the maxima in the first spectrum.

In one set of embodiments, a composition including a chromophore can absorb energy, e.g., from a quantum of electromagnetic radiation, i.e., where the absorbed energy is present within the composition as "excitation" energy, to cause the composition/precursor to achieve an "excited" state. In one embodiment, the composition/precursor is an emissive polymer or other emissive composition capable of emitting radiation, as further described below. As used herein, "emissive" and "emissivity" are given their ordinary meaning as used in the art, e.g., the amount of energy (typically in the form of light energy or other forms of electromagnetic radiation) produced by the composition, for instance, as measured with respect to the energy used to excite the composition. In some cases, a chromophore of the composition is emissive. A composition that is "emissive" may be able to re-emit a significant amount of the energy incident to the composition, e.g., as electromagnetic radiation. For example, an emissive composition may have a quantum yield of at least about 20%, at least about 25%, at least about 30%, least about 35%, at least about 40%, at least about 45%, or at least about 50%, where "quantum yield" refers to a number of photons emitted per photon adsorbed by the composition. In contrast, a "substantially non-emissive" composition or precursor is not able to re-emit a significant amount of the energy incident to the composition or precursor, but instead loses the energy in some other fashion, e.g., through vibrational changes, as heat or kinetic energy, structural changes, etc.

In some embodiments, a composition of the invention includes a chromophore has a quantum yield of at least about 0.05 times the quantum yield of the composition or precursor in solution, in some cases at least about 0.1 times the quantum yield in solution, in some cases at least about 0.15 times the quantum yield in solution, in some cases at least about 0.2 times the quantum yield in solution, in some cases at least about 0.25 times the quantum yield in solution, in some cases at least about 0.3 times the quantum yield in solution, in some cases at least about 0.4 times the quantum yield in solution, and in some cases at least about 0.5 times the quantum yield in solution.

In one set of embodiments, the emitted radiation is emitted as luminescence, in which "luminescence" and "luminescent" are given their ordinary meanings as used in the art. Luminescent emissions may include emissions of ultraviolet or visible radiation. Specific types of luminescence include "fluorescence," in which a time interval between absorption and emission of visible radiation ranges from about $10^{-12}$ s to about $10^{-7}$ s. "Chemiluminescence" refers to luminescent emission of luminescent radiation due to a chemical reaction, and "electrochemiluminescence" refers to emission of luminescent radiation due to an electrochemical reaction.

Typically, fluorescence is "quenched" when a chromophore in an excited state is exposed to an "acceptor" species that can absorb energy from the excited state chromophore. The excited state chromophore then returns to a ground state due to nonradiative processes (i.e., without emitting radiation), resulting in a reduced quantum yield. Thus, an excited state chromophore can function as a "donor" species in that it transfers energy to the acceptor species. The acceptor species can be an external molecule such as another composition or precursor, or an internal species such as another portion of the same composition.

In one set of embodiments, by reducing the extent of luminescent quenching, luminescence lifetimes may be increased and excitation energies may be able to travel along a longer pathway within a composition of the invention. This pathway can be referred to as an "energy migration pathway," which is a pathway that can efficiently transport excitation energy therethrough, such as electronic excitation energy. In some cases, the energy migration pathway can be defined by one or a series of atoms. In one embodiment, the pathway has a length of at least about 20 Å or about 30 Å. In some cases, the energy migration pathway may have a length of at least about 40 Å or a length of at least about 50 Å. In some cases, the pathway may comprise a series of atoms having a series of electronic energy states accessible to the excitation energy to be transported.

Accompanying this advantageous feature of longer pathways and lifetimes of a composition of the invention is enhanced amplification of emission. The amplification of emission may be related to a distance over which excitation energy can travel along an energy migration pathway. Thus, another aspect of the present invention provides a method for amplifying an emission. The method involves providing an article comprising a composition having an energy migration pathway and a chromophore. In one embodiment, the chromophore can be a reporter chromophore. The energy migration pathway can include conjugated groups in some cases. Exposing the article comprising the composition to a source of energy forms an excitation energy within the composition which is allowed to travel through the energy migration pathway. The excitation energy can travel through the migration pathway and be transferred to a chromophore in electronic communication with the energy migration pathway, whereby an enhanced radiation can be emitted from the chromophore. An excitation energy can be transferred from the migration pathway to the chromophore if the chromophore is in electronic communication with the pathway, i.e. the chromophore has an accessible energy state by which the excitation energy traveling through the migration pathway can be transferred to. Thus, the emission of any number of compositions can be enhanced using certain embodiments of the invention. In one embodiment, energy migration may be enhanced if energy migration occurs in a direction along an energy migration pathway where the atoms along the pathway have a HOMO-LUMO gap therein which continually or generally decreases as migration proceeds. Energy can also be transferred from the energy migration pathway to a reporter chromophore to cause an emission of radiation from the chromophore associated with the excitation energy. In one embodiment, the reporter chromophore can be bonded to or associated with a composition (or precursor) in some fashion. For example, if the composition (or precursor) is a polymer, the reporter chromophore may be bonded to the polymer as a portion of the backbone as a pendant side group, etc. In another embodiment, the reporter chromophore is a molecule external to the composition, but able to communicate energetically and/or electronically with the composition.

In one set of embodiments, an emission from a reporter chromophore (e.g., produced by the above-described mechanism) is greater than an emission from a reporter chromophore in a composition or precursor that is free of an energy migration pathway. A composition or precursor that is "free of an energy migration pathway" typically refers to compositions or precursors that are incapable of efficiently transporting excitation energies therethrough, e.g., polymers having a completely carbon-based saturated backbone lacking pendant chromophores, etc.

The energy transfer from the energy migration pathway to the reporter chromophore may be facilitated or even amplified in some instances if the reporter chromophore has a HOMO-LUMO gap less than at least a portion of the energy migration pathway. In certain cases, to enhance migration or amplification of energy, the reporter chromophore may have a HOMO-LUMO gap less than the HOMO-LUMO gap of a substantial portion of the energy migration pathway, for instance, to maximize the distance that the excitation energy is able to travel along an energy migration pathway before being transferred to the reporter chromophore.

In one aspect, the invention provides a sensor that is capable of detecting electrophiles, i.e., analytes having electrophilic moieties, such as certain chemical warfare agents and/or insecticides. In some cases, the electrophile can be detected while in a gaseous or a liquid phase. Examples of chemical warfare agents that can be detected according to the invention include, but are not limited to, satin, phosgene, soman, tabun and thionyl chloride. Other non-limiting examples of electrophiles detectable using the compositions and precursors of the invention include, but are not limited to, the following structures:

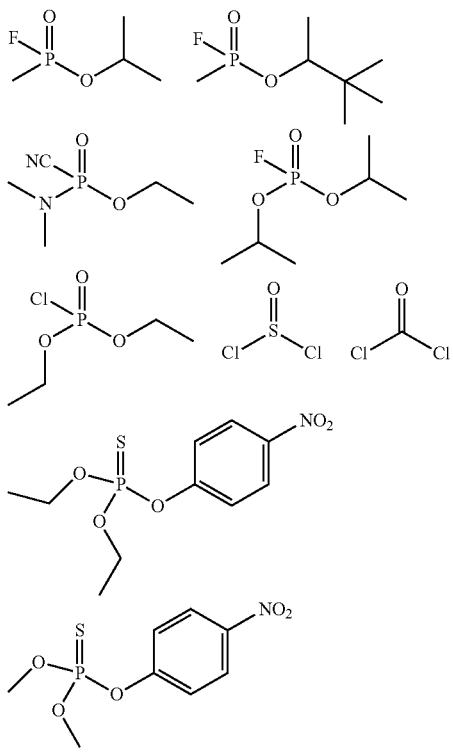

In one set of embodiments, the sensor is capable of detecting an electrophile that includes an electrophilic atom, such as an electrophilic phosphorous, sulfur, or arsenic atom (for example, a phosphate ester). In some cases, the electrophilic phosphorous, sulfur, or arsenic atom has more than one electronegative (i.e., electron-withdrawing) substituent on it. Examples of electronegative substituents include, but are not limited to, halogens, pseudohalogens, alkoxides, phenols, alkyls, alkenyls, alkynyls, or the like. For example, in some cases, the sensor may be capable of detecting an electrophile having a structure:

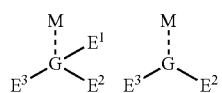

where $E^1$, $E^2$ and $E^3$ (when present) are electron-withdrawing moieties such as halogens, pseudohalogens, or alkoxide groups; G is an electrophilic phosphorous, sulfur, or arsenic atom; and M comprises an atom able to form a multiple bond (indicated by ----) with G, for example, nitrogen (e.g., an amine) or a chalcogen. In some cases, M may be an electron-withdrawing moiety. As an example, if M is oxygen, the electrophile may include a phosphate ester or an arsenic ester moiety. As used herein, "electrophilic" is given its ordinary definition as used in the art, e.g., a compound or moiety able to accept an electron pair from a molecule with which it forms a covalent bond. Non-limiting examples of electrophiles having an electrophilic phosphorous, sulfur, or arsenic atom include compounds having any of the following structures:

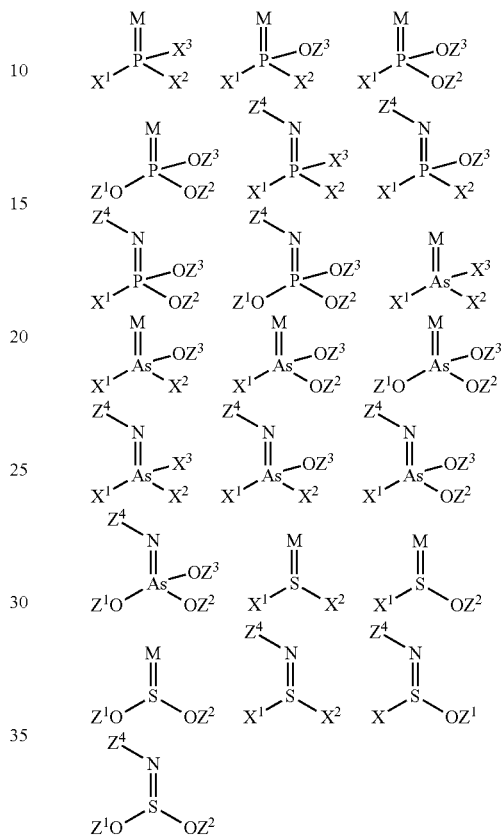

where $Z^1$, $Z^2$, $Z^3$, and $Z^4$ (when present) each independently is an organic moiety (i.e., a moiety containing carbon, for example, an alkyl group, an aryl group, a polymer, etc.), M is a chalcogen (e.g., oxygen, sulfur, or selenium), and X is an electron-withdrawing moiety, as further described below. If a Z-group (i.e., $Z^1$, $Z^2$, $Z^3$, and/or $Z^4$) is an organic moiety, then the Z-group can be, for example, an alkyl such as a linear alkyl, a branched alkyl, a cyclic alkyl, etc., for instance, methyl, ethyl, propyl, isopropyl, butyl, isobutyl, pentyl, isopentyl, 1,2,2-trimethylpropyl, cyclopentyl, cyclohexyl, cycloheptyl, cyclohexenyl, or the like; an aryl such as paranitrophenyl; an alkylaryl; an arylalkyl, etc.

In another set of embodiments, the sensor is capable of detecting an electrophile that includes an electrophilic carbon atom multiply-bonded to another electrophilic atom. For example, in some cases, the sensor may be capable of detecting an electrophile having a structure:

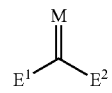

where $E^1$, and $E^2$ are electron withdrawing moieties such as halogens, pseudohalogens, or alkoxide groups, and M comprises an atom able to form a double bond with the carbon atom, for example, nitrogen (e.g., and amine) or a chalcogen, such as oxygen or sulfur. Non-limiting examples of such electrophiles include compounds having any of the following structures:

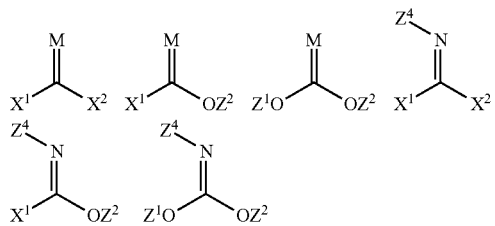

As used herein, terms such as "electron-withdrawing" and "electron-poor" are given their ordinary meaning as used in the art, i.e., moieties generally deficient in electrons. Non-limiting examples of electron-withdrawing or electron-poor moieties include the halogens, amines, $NH_3$, $NO_2$, CN, SCN, OCN, pyridinium, etc. Similarly, as used herein, terms such as "electron-donating" and "electron-rich" are also given their ordinary meaning as used in the art, i.e., moieties generally having an excess of electrons. Non-limiting examples of electron-rich or electron-donating moieties include OH, OR, $NR_2$, $NH_2$, thienyl, etc.

The term "halogen," or equivalently, "halogen atom," as used herein, is given its ordinary meaning as used in the field of chemistry. The halogens include fluorine, chlorine, bromine, iodine, and astatine. Preferably, the halogen atoms used in the present invention are fluorine, chlorine, bromine, or iodine.

As used herein, an "alkyl" is given its ordinary meaning as used in the field of organic chemistry. Alkyl (i.e., aliphatic) groups useful or potentially useful for practicing the invention can contain any of a wide number of carbon atoms, for example, between 1 and 20 carbon atoms, between 1 and 15 carbon atoms, between 1 and 10 carbon atoms, or between 1 and 5 carbon atoms. In some embodiments, the alkyl group will contain at least 1 carbon atom, at least 3 carbon atoms, at least 5 carbon atoms, or at least 10 carbon atoms; in some cases, the alkyl group will also have at most 10 carbon atoms, at most 5 carbon atoms, or at most 3 carbon atoms. Typically, an alkyl group is a non-cyclic structure. The carbon atoms within the alkyl moiety may be arranged in any configuration, for example, as a straight chain (i.e., a n-alkyl such as methyl, ethyl, propyl, butyl, pentyl, or hexyl) or a branched chain (e.g., a t-butyl group, or an isoalkyl group such as an isopropyl group). The alkyl moiety may contain only single bonds, or alternatively, may contain one or more double or triple bonds, for example, as in an alkene, an alkyne, an alkadiene, an alkadiyne, an alkynene, etc. The alkyl moiety may also contain one or more substituents in some embodiments. For example, in certain embodiments, the alkyl group may contain a halogen, an alkoxy (e.g., methoxy or ethoxy), an amine (e.g., a primary, secondary, or tertiary amine), or a hydroxide as a substituent. If more than substituent is present within the alkyl moiety, then the substituents may each be the same or different.

As used herein, the term "chalcogen," or equivalently, "chalcogen atom," is given its ordinary meaning as used in the field of chemistry. The chalcogens include oxygen, sulfur, selenium, tellurium, and polonium. Preferably, the chalcogen atoms used in the present invention include one or more of oxygen, sulfur, selenium, or tellurium. In certain embodiments of the invention, the chalcogen atoms are oxygen, sulfur, and selenium; or, in some cases, oxygen and sulfur.

In some embodiments of the invention, the sensor is capable of detecting an analyte that is an electrophile which is, or is able to form, an alkylating agent. As used herein, an "alkylating agent" is given its ordinary definition as used in the art, i.e., an agent that has an alkyl group able to react with a compound such that the alkyl group is transferred to the compound and the compound forms a covalent bond with the alkyl group (i.e., the compound becomes "alkylated"). In one embodiment, the analyte is an electrophile but is not an alkylating agent itself and, upon reaction with a composition and/or precursor of the invention, forms an alkylating agent as a by-product of the reaction. As an example, if the composition has a structure

, the electrophile may react with the composition to form an alkylating agent comprising a structure OY (i.e., a "strong" electrophile). In another embodiment, the analyte is itself an alkylating agent, i.e., the analyte is able to react with a composition and/or precursor to directly cause alkylation of the composition/precursor. Examples of such analytes include, but are not limited to, blister agents such as nitrogen or sulfur mustards. In yet another embodiment, an analyte, which may be a nerve agent such as tabun, sarin, or soman, upon reaction with a composition and/or precursor of the invention, is converted to a product that includes an alkylating moiety (i.e., the product is itself an alkylating agent). The alkylating moiety of the product can, in some cases, further react in some detectable fashion (e.g., through self-reaction), for example, producing a cyclic compound, producing a compound having an altered emissivity, etc.

In one set of embodiments, "activation" of the sensor by an analyte may result in a reporter chromophore of the composition having a lower energy resulting in a decrease in a HOMO-LUMO gap of the composition. In one embodiment, activation by an analyte of the composition results in a chromophore having a smaller HOMO-LUMO gap than that of at least a portion of the migration pathway and preferably smaller than a substantial portion of the migration pathway. Activation of the sensor can also be caused when an analyte reacts or otherwise interacts with a composition or precursor, and the combination of analyte and composition/precursor is capable of activating a chromophore within the sensor. In some cases, the activated chromophore may be detected by a change in the wavelength and/or intensity in emission arising from the chromophore.

Another set of embodiments of the present invention provides a sensor having a reporter chromophore capable of emission, wherein the emission is variable and sensitive to an electric field of a medium surrounding the chromophore. Selective matching of energies involved in the energy migration pathway to a vast array of the activated and unactivated chromophores, as described above, can produce enhanced emissions. The sensor, in some cases, includes any of the compositions or precursors described herein.

Another set of embodiments of the present invention provides a sensor comprising an article including at least one film or layer containing a composition and/or precursor as described herein. In some cases, the film or layer may have a thickness of less than about 1 millimeter, less than about 500 microns, or less than about 100 microns. The composition or precursor may include a reporter chromophore in certain cases. The article may further comprise an activation site in some instances, where the reporter chromophore is capable of activation by an analyte interacting with the activation site in some fashion; for example, an energy migration pathway within the composition or precursor may allow energy to be transferred along the pathway from the activation site to the chromophore. In one set of embodiments, the film or layer includes nitrocellulose. The composition or precursor may be covalently bonded to the film or layer, coated on the film, blended with the film, or the like. As on example, the composition or precursor may be linked to the film or layer, or a component thereof (e.g., a polymer) through a covalent bond. In some cases, the linkage between the composition or precursor and the film or layer may include an energy migration pathway; in other cases, however, the linkage may be free of an energy migration pathway.

Referring now to FIG. 1, as one example, a sensor according to an embodiment of the invention may include inventive composition or precursor 551 having reporter chromophores 552 positioned thereon. Chromophores 552 can also be dispersed within a bulk of composition/precursor 551 in certain cases. Energy 553 incident on the sensor may cause composition or precursor 551 to form an excited state having excitation energy 555. Excitation energy 555 can be transported in this example through migration pathway 550, defined within composition/precursor 551. The excitation energy can be transferred between various energy states within energy migration pathway 550 through a series of atoms or moieties having equivalent or decreasing HOMO-LUMO gap progressing towards chromophore 552. If chromophore 552 has a HOMO-LUMO gap greater than a HOMO-LUMO gap of at least a portion of the energy migration pathway 550, and more preferably greater than a substantial portion of energy migration pathway 550, energy transfer of energy 555 between energy migration pathway 550 and chromophore 552 may not occur, and emission 554 may result. If, however, chromophore 552 is activated in some fashion by an analyte (not shown), e.g., as previously described, chromophore 552 may be transformed into reporter chromophore 556, where a HOMO-LUMO gap of reporter chromophore 556 is less than a HOMO-LUMO gap of at least a portion of the energy migration pathway 550, and more preferably less than that of a substantial portion of energy migration pathway 550. Thus, after interaction of an analyte with chromophore 552 to form chromophore 556, energy transfer can occur between composition 551 and activated chromophore 556 along energy migration pathway 550 to cause emission 558, thus indicating the detection of the analyte by the sensor.

As another non-limiting example of a sensor of the invention, a sensor may have a composition (or a precursor composition) containing a first chromophore of a first color and a second chromophore of a second color. Before activation of the sensor by an analyte, the sensor may have the appearance of the first color, or the sensor may have an appearance that does not correspond to either the first color or the second color. Upon activation, e.g., by interacting with an analyte, the first chromophore can have a lower energy state (i.e., red-shifted) that may allow optimal energy transfer from the first chromophore to the second chromophore in some cases, e.g., through an energy migration pathway. The second chromophore may exhibit a second color due to the transference of energy from the first chromophore and the composition overall may thus have the appearance of the second color after interaction with analyte. Thus, it is a feature of an embodiment of the present invention that a composition can amplify an emission by channeling all of the emission through a few activated luminescent chromophores. In this way, only a small number of reporter chromophores may need to be activated to effect a total change in an appearance of the composition. Thus, detection of an analyte by certain embodiments can be observed or otherwise detected in some cases, e.g., by a color change, and/or a change in luminescence of the composition.

In one aspect, a composition or precursor of the invention may react with an analyte in some fashion that results in an alteration of the atomic structure of the composition or precursor. In some cases, the film or layer may have a thickness of less than about 1 millimeter, less than about 500 microns, or less than about 100 microns. In some cases, the analyte may be an electrophile. In one set of embodiments, a composition or precursor of the invention may have a structure:

where the structure

comprises an organic moiety (e.g., an alkyl, an aryl, an alkylaryl, etc.), Q̈ is an atom having a lone pair of electrons that can participate in alkylation (e.g., a nitrogen or oxygen atom), and Y is one of H or $SiR_3$, where each of the R's of $SiR_3$ can independently be hydrogen or an organic moiety, such as an alkyl group. The structure

indicates the presence of a series or chain of atoms (i.e., a "bond path") present between O and Q̈, for example, a chain of 4 atoms, 5 atoms, 6 atoms, 7 or more atoms, etc. between O and Q̈. In some cases, e.g., where there may be rings, aromatic and/or conjugated groups (e.g., benzene rings or phenyl groups), side branches, etc., present in the bond paths between O and Q̈, the shortest bond path between O and Q̈ may include 4 atoms, 5 atoms, 6 atoms, 7 or more atoms, etc, where the shortest bond path is the path between two points containing the fewest number of atoms.

As an example, in certain cases, a structure

may include one or more conjugated portions between O and Q̈. As a specific example, if the conjugated portion of the structure includes at least 4 carbon atoms, the structure may be represented as:

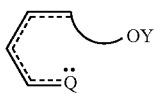

where the structure

comprises at least one conjugated group, and

comprises at least one or more carbon atoms not conjugated to the structure

In certain specific cases, the structure

may comprise at least two, three, or four conjugated groups. Non-limiting examples of multiple conjugated groups include:

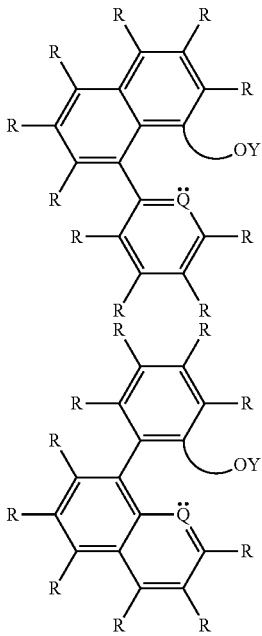

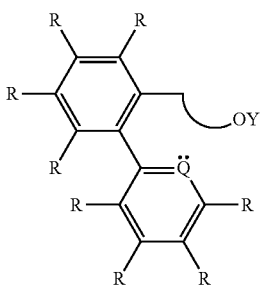

where each R shown above independently can be hydrogen or an organic moiety such as an alkyl group or an aromatic group. In certain instances, two or more R's together in the structures above may define a conjugated group.

Other examples of

include, but are not limited to:

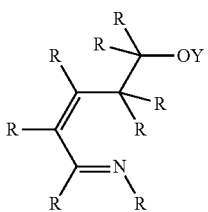 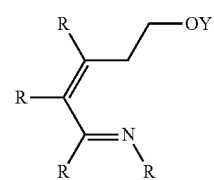

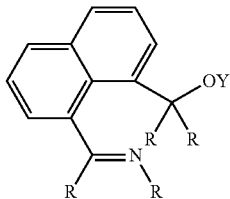 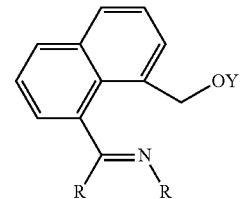

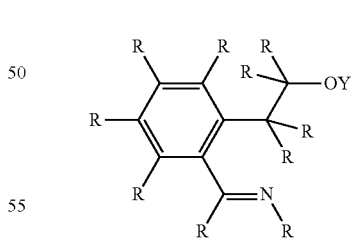 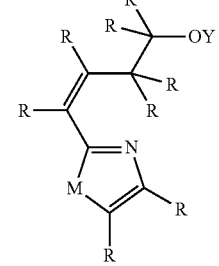

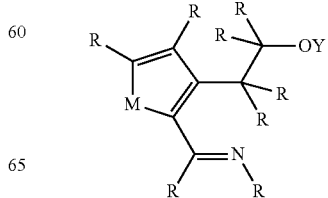 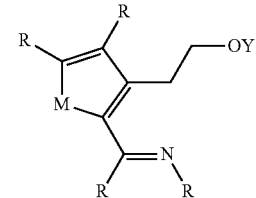

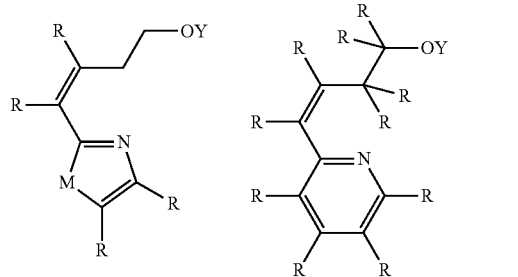
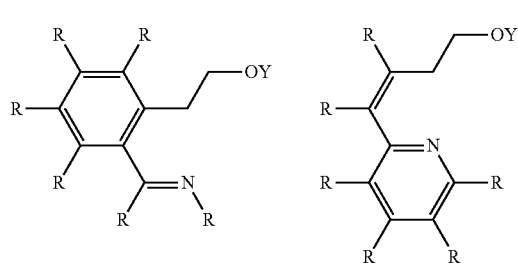
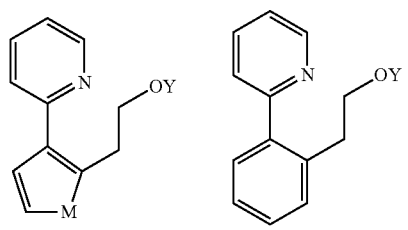
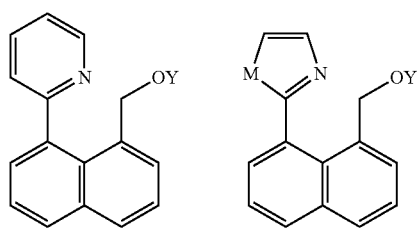
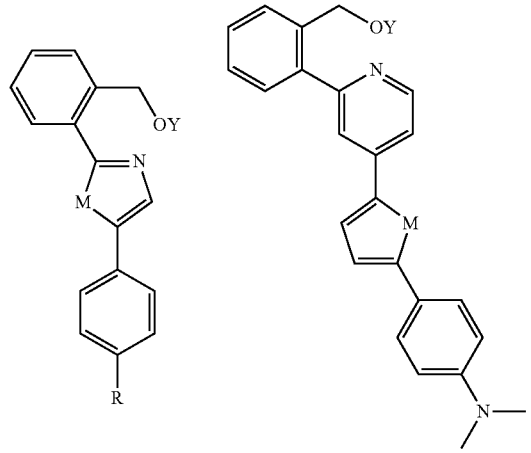
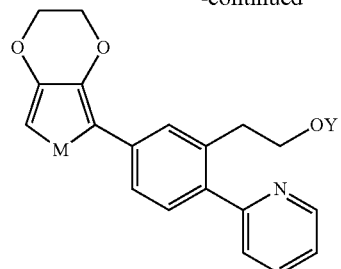
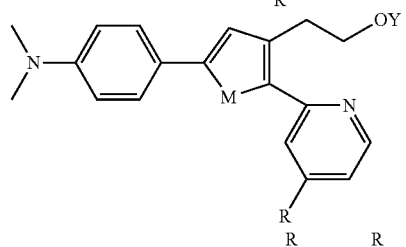
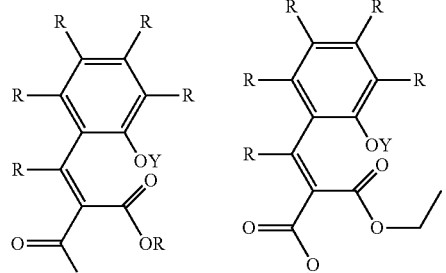
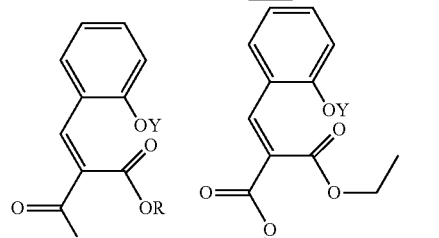
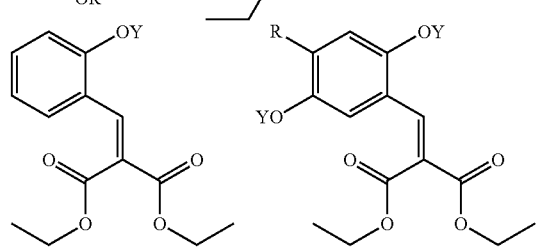
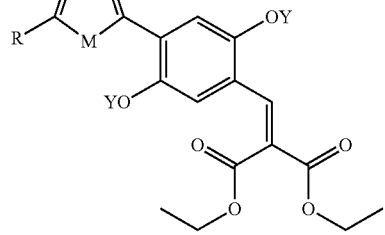
where each R shown above independently can be hydrogen or an organic moiety, such as an alkyl group or an aromatic group, M is a chalcogen such as oxygen or sulfur, and Y is one of H or $SiR_3$, where each of the R's in $SiR_3$ can independently be hydrogen or an organic moiety. In some cases, any of the organic moieties described above may include a conjugated group. In certain instances, two or more R's together in the structures above may define a conjugated group.

As another example, a structure

may be able to react with an electrophile.

In one set of embodiments, the electrophile may be a strong electrophile, i.e., as previously described.

Other non-limiting examples of suitable organic moieties within structure

include amines (e.g., primary, secondary, tertiary, or quaternary amines), or structures such as:

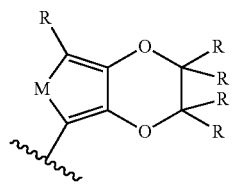

where each R in this structure may be hydrogen or an organic moiety, and M is a chalcogen. In some cases, all of the above R moieties can be hydrogen.

In another set of embodiments, at least a portion of the composition or precursor is able to cyclize upon reaction or other interaction of the composition or precursor with an analyte. In certain instances, the resulting cyclized product may have a greater emissivity and/or band gap than the composition or precursor. In one embodiment, a reaction of a composition or precursor having a structure:

with a compound having a structure Z—X may result in at least a first product having a cyclic structure:

and a second product having a structure X—OY (there may be additional products as well, in some cases). In the first product, the atom originally bonded to the OY group is now bonded to the Q̇ atom, as represented by the vertical line and the loss of the OY group from the structure (i.e., as a leaving group). In one embodiment, the compound having the structure Z—X is an electrophile.

In one embodiment, the composition or precursor may have a high degree of specificity to an electrophile, e.g., having an electrophilic atom such as an electrophilic phosphorous, sulfur, or arsenic atom. Such compositions may be generally unreactive to other compounds that do not contain electrophilic phosphorous, sulfur, or arsenic atoms, for example, acids or other background compounds. In one embodiment, the composition or precursor has a structure:

where Q̇ represents a nitrogen atom. The compositions or precursors, in some cases, may be used to specifically detect or determine a single analyte, or certain types or ranges of analytes, for example, analytes containing electrophilic phosphorous, sulfur, and/or arsenic atoms. The compositions or precursors of the invention can be used in certain instances to distinguish the analyte(s) from other compounds with a high degree of sensitivity.

In some cases, a composition or precursor of the invention can react or otherwise interact with an analyte to produce a composition having a structure:

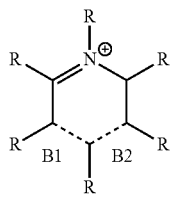

where each R shown above can be hydrogen or an organic moiety. In some cases, at least one of the R moieties, singly or together, may include at least one conjugated group. In the above structure, each of B1 and B2 is a single bond or a double bond such that B1 and B2 are not both double bonds. Other compositions, of course, may be produced in the above-described reaction as well. For example, in certain cases, the composition or precursor is able to react with an analyte to produce a composition having a structure such as the following:

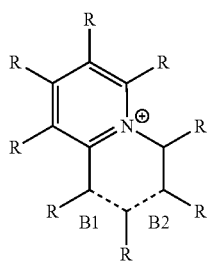 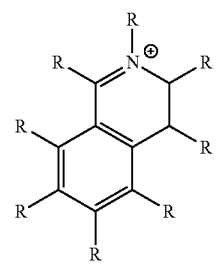

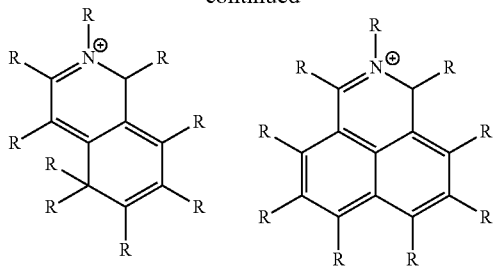

where each R may be hydrogen or an organic moiety. In certain instances, two or more R's together in the above structures may define a conjugated group.

In another embodiment of the invention, a composition or precursor of the invention may be used to detect a broad range of analytes, e.g., not limited only to electrophiles having an electrophilic phosphorous, sulfur, or arsenic atom. Thus, in certain instances, the composition or precursor may exhibit broader reactivity to different analytes or reactants, for instance, to other electrophiles or alkylating agents, acids (e.g., $H^+$ or Lewis acids), nucleophiles such as fluoride, etc. In one embodiment, the composition has a structure:

where $\ddot{Q}$ represents an oxygen atom. In some cases, the composition or precursor is able to react with the analyte to produce a composition having a structure:

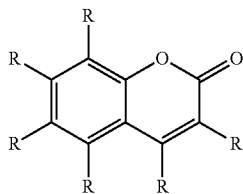

where each R in the above structure can be hydrogen or an organic moiety. In some cases, at least two of the R moieties together may define a conjugated group. Non-limiting examples of such structures have been previously described. In one embodiment, all of the above R moieties are hydrogen.

In another set of embodiments, any of the compositions or precursors described herein may have increased conjugation upon reaction or other interaction with an analyte such as an electrophile, relative to the analyte and the initial composition or precursor, and/or to any of the compounds involved in the reaction producing the composition having increased conjugation. For example, the resulting composition may have increased conjugation between two conjugated groups not previously substantially conjugated before reaction of the composition with the analyte. In certain cases, the resulting composition may have increased structural rigidity, relative to the analyte and/or the initial composition or precursor, and/or to any other compounds involved with the reaction producing the resulting composition.

In yet another set of embodiments, the composition or precursor of the invention can be represented by a structure:

EP-ER-OY where EP comprises an electron-poor moiety, ER comprises an electron-rich moiety, and Y is one of H or $SiR_3$, where each of the R's can independently be hydrogen or an organic moiety. Suitable electron-poor and electron-rich moieties have been described above. Upon reaction or other interaction of an initial composition or precursor (which may be substantially non-emissive in some cases) with an analyte (e.g., an electrophile, an alkylating agent or a phosphate ester, etc.), a resulting composition of the reaction/interaction may have a higher degree of emissivity, a higher band gap, and/or a higher quantum yield than the initial composition or precursor. In certain cases, the resulting composition may have a quantum yield of at least about 40%, at least about 45%, at least about 50%, or at least about 55% or more. In some cases, these composition may have broader, non-specific reactivity to the analytes.

FIG. 3 shows an example of chemical groups that are reactive with any of the analytes previously described, for example, analytes having phosphate ester groups, e.g., as found in chemical warfare agents and insecticides. In FIG. 3, structure 1130, upon reaction with phosphate ester structure 1132 results in cyclization of the compound to form structure 1134. Typically, reporter chromophores such as group 1130, when present, have higher energy absorptions and can be less emissive than reporter chromophores having structures such as structure 1134. In the transformation from a less emissive to a more emissive structure, the band gap of the composition changes from high to low. A specific example of structure 1130 is structure 1136 in FIG. 3B, which undergoes cyclization upon reaction with a phosphate ester structure 1132 through intermediate 1138 to produce a cyclized compound 1140. In this example, X can be Cl, F, CN or other electron-withdrawing substituents; Y can be hydrogen or $SiR_3$; and $Y_1$ and $Y_2$ can be conjugated groups such as aromatic rings. Other examples of structures that are sensitive to phosphate esters are shown as groups 1142-1146, where Y can be hydrogen, an alkyl group or an alkoxy group, preferably methyl and methoxy and hydrogen. Y can also be $SiR_3$, which can provide selectivity to agents such as those having X=fluorine atom in position "X."

In another aspect, the composition or precursor of the invention includes a polymer. As used herein, a "polymer" is an extended molecular structure comprising a backbone which optionally contains pendant side groups, where the "backbone" refers to the longest continuous bond pathway within the polymer. In cases where the composition or precursor is a polymer, the entire polymer backbone (or a substantial portion) may be conjugated and the polymer is referred to in such cases as a "conjugated polymer." Polymers having a substantially conjugated pi-backbone capable of conducting or transmitting electronic excitations are typically referred to as "conducting polymers." In certain cases, the polymer may be substantially planar. An example of a conjugated pi-backbone defining essentially a plane of atoms are the carbon atoms of a polyacetylene chain. Other non-limiting examples of polymers useful in the invention include polystyrenes, polyethylene oxides, polyethylenes, polysiloxanes, polyphenylenes, polythiophenes, poly(phenylene vinylene)s, polysilanes, polyethylene terephthalates, poly (phenylene ethynylene)s and other polyarylenes, polyarylene vinylenes, polyarylene ethynylenes, ladder polymers, etc. Those of ordinary skill in the art will be aware of other suitable polymers. In some cases, the polymer of the composition or precursor may include a ladder polymer, for example, for structural or molecular stability or rigidity. As used herein, a "ladder polymer" is a polymer having a backbone that can only be severed by breaking two bonds. Non-limiting examples of such ladder polymers include polythiophenes, polypyrroles, polyacetylenes, polyphenylenes and substituted derivatives thereof.

In one set of embodiments, the polymer backbone is conjugatable to at least one chromophore. For example, the chromophore may be substantially unconjugated to the backbone, but, upon reaction or other interaction of the composition or precursor to an analyte, at least some of the chromophores become conjugated to the backbone, for example, through a chemical reaction. In certain instances, a composition or precursor of the invention may be conjugatable to at least two chromophores, at least three chromophores, at least five chromophores, at least ten chromophores, at least twenty-five chromophores, at least fifty chromophores, or at least one hundred or more chromophores. In some embodiments, the polymer backbone includes a plurality of chromophores optionally interrupted by conjugated and/or non-conjugated groups. Non-conjugated groups include saturated units moieties, as a chain of alkyl groups optionally interrupted by heteroatoms. In one embodiment, the polymer backbone, which can be either conjugated or non-conjugated includes a chromophore attached as a pendant group. In certain other embodiments, the polymers can either comprise chromophore monomeric units (e.g., within a polymer backbone), or chromophores interspersed between other conjugated groups. In some cases, one or more monomeric units can combine to form a chromophore. For example, in polythiophene, the chromophore may include one or more thiophene groups.

The polymer may be, in some embodiments, a homo-polymer or a co-polymer such as a random co-polymer or a block co-polymer. In one embodiment, the polymer is a block co-polymer. An advantageous feature of block co-polymers is that the effect of a multi-layer can be mimicked without requiring multiple layers or multiple polymer types. Each block of the co-polymer can have different band gap components and, by the nature of the chemical structure of a block co-polymer, each block can be segregated. Thus, by using such structures, amplified emissions can be achieved with block co-polymers, and a broad scope of structures can be produced. Band gaps, amplifications and selectivities for analytes within such a polymeric structure can be achieved in many cases by modification or incorporation of different polymer types into a block co-polymer. in some cases, the co-polymer can be varied (e.g., continuously) to give a tapered block structure. In certain cases, the co-polymers can be synthesized by either step growth or chain growth methods. Those of ordinary skill in the art will know how to design and synthesize appropriate co-polymers.

In one set of embodiments, a polymeric precursor of the invention may have a structure:

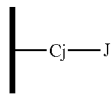

where | is a substantially pi-conjugated polymer backbone (e.g., any of the above-described polymers), Cj is non-existent or comprises at least one conjugated group (e.g., as previously described), and J is a moiety, such as an aromatic moiety or a conjugated group, not substantially pi-conjugated with |. In one embodiment, Cj may comprise one or more thiophene moieties, for example, as in an oligomeric chain:

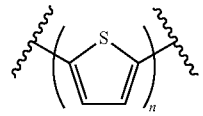

where n is any positive integer (e.g., from 1-100, from 1-50, from 1-20, from 1-10, from 1-5, etc.). In other embodiments, Cj may comprise conjugated groups such as one or more double and/or triple bonds, benzene rings, naphthalene rings, anthracene rings, furans, etc. Other suitable conjugated groups have been previously described.

In one set of embodiments, J may be any structure able to react or otherwise interact with an analyte. In some cases, J may be a structure that is substantially non-emissive, but becomes emissive upon reaction or other interaction of the structure with an analyte. In certain instances, J may be a structure that is emissive, but is able to increase or decrease its emissivity upon reaction or other interaction with an analyte. In one embodiment, J may comprise any structure described herein, e.g., a structure such as:

as previously described.

In some embodiments, the above-described polymer is able to react with an analyte such that J becomes pi-conjugated with at least one of | and Cj (if present) upon reaction or other interaction of J with an analyte (e.g., a chemical warfare agent or an electrophile). In another embodiment, a polymer, upon reacting or interacting an analyte, is able to form a composition having an emissivity and/or a band gap that is altered with respect to the initial polymer (i.e., the emissivity and/or band gap may increase or decrease). In yet another embodiment, the polymer, upon reacting or interacting with an analyte, may form a polymer having an enhanced quantum yield with respect to the initial polymer.

Any of the reactions producing compositions of the invention described above (e.g., from compositions or precursors such as those described herein) may be carried out under suitable conditions that can be determined by those of ordinary skill in the art. In some cases, the reactions may be carried out under ambient conditions (e.g., in air at a temperature of about 25° C. and about 1 atm), or outside or "field" conditions. For example, a sensor containing a composition or precursor may be brought to a site suspected of being contaminated with, e.g., from one or more detectable analyte land mines, unexploded ordinances, chemical warfare agents, etc. The sensor may be used to detect the presence, location, and/or concentration of the analytes that may be present at the site.

In another aspect, a sensor of the invention may also include an article able to provide enhanced rigidity, sensitivity, selectivity, stability, or a combination of any number of these and/or other features, to any of the above-described compositions or precursors in the sensor. The article is typically positioned adjacent the composition or precursor and may be, in some cases, selected from the group consisting of beads, nanoparticles, polymers such as polymer fibers, waveguides, and a film. In other cases, the article may include a species selected from the group consisting of a biological species, a polymer, a ceramic, a conductor and a semiconductor. Examples of biological species include, but are not limited to, a peptide, an oligonucleotide, an enzyme, an antibody, a fluorescent peptide, a fluorescent oligonucleotide and a fluorescent antibody. Non-limiting examples of polymers suitable for the article include polystyrene, polyethylene oxide, polyethylene, polysiloxane, polyphenylene, polythiophene, poly(phenylene vinylene), polysilane, polyethylene terephthalate, poly(phenylene ethynylene), polyarylenes, polyarylene vinylene, and polyarylene ethynylene. Examples of semiconductor and luminescent materials suitable for the article can be selected from the group consisting of solids and nanoclusters; examples of semiconductor materials include, for instance, Group II/VI, Group III/V and Group IV semiconductors such as CdS, CdSe, InP, GaAs, Si, Ge and porous silicon. One non-limiting example of a suitable conductor is colloidal gold. Non-limiting examples of suitable ceramics include glass, quartz, titanium oxide and indium tin oxide. The above examples are non-limiting and other equivalents can be readily determined by those of ordinary skill in the art.

In one set of embodiments, a sensor of the invention is capable of enhancing the emission of a composition or precursor able to react or other interact with an analyte for example, after binding of the analyte to the precursor or composition. For example, a sensor can be provided comprising a composition or precursor positioned adjacent a waveguide. Light emitted by the composition (e.g., reaction or interaction with an analyte) in one area can be captured by internal reflection within the sensor (e.g., within the substrate), then reabsorbed and/or re-emitted in a different region of the sensor. Sequential light emission and resorption cycles may increase the sensitivity of the sensor in some cases, as this process can occur multiple times before reaching a detector, thus illustrating a sensor having enhanced sensitivity.

Figure 4:
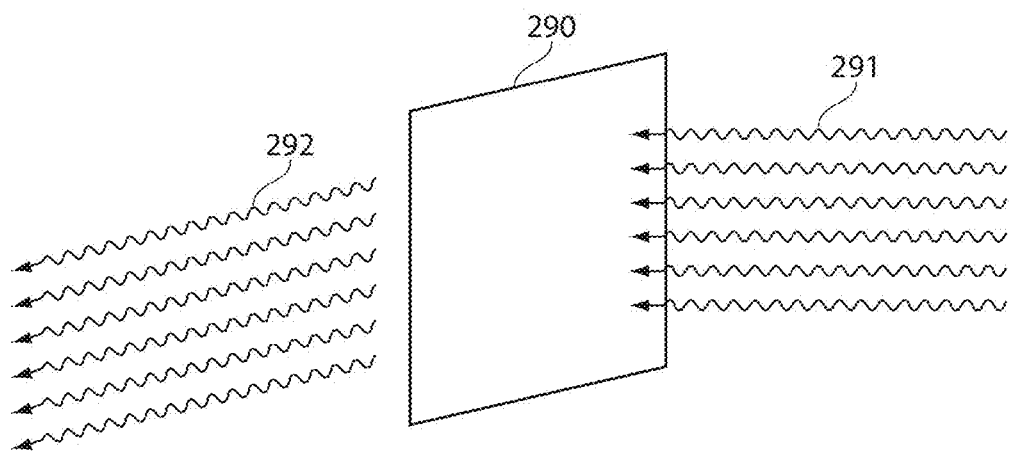
FIG. 4 shows a device, in accordance with one embodiment of the invention, comprising a transparent support coated with a film capable of amplifying emission through sequential emission and re-absorption cycles.

An example of a device that can achieve this effect is shown in FIG. 4, where a sensor 290 (e.g., a film of material) includes a composition or a precursor of the present invention. The sensor is excited by a source of energy 291, and emission 292 is detected from the sensor, for instance, from an edge of an opposite side of the support 290. Thus, FIG. 4 illustrates an embodiment of the invention having an enhanced sensitivity of a composition or precursor (e.g., as previously described) to an analyte. In some cases, a further optimization of this device can be achieved by using a waveguide. For example, excitations in the device caused by light (e.g., upon reaction or other interaction of a composition or precursor to an analyte) can be initiated at one terminus of the waveguide, and at least a portion of the light emerging from an opposite terminus will have undergone multiple emission and re-absorption cycles, thus displaying an enhanced sensitivity.

Figure 2A:
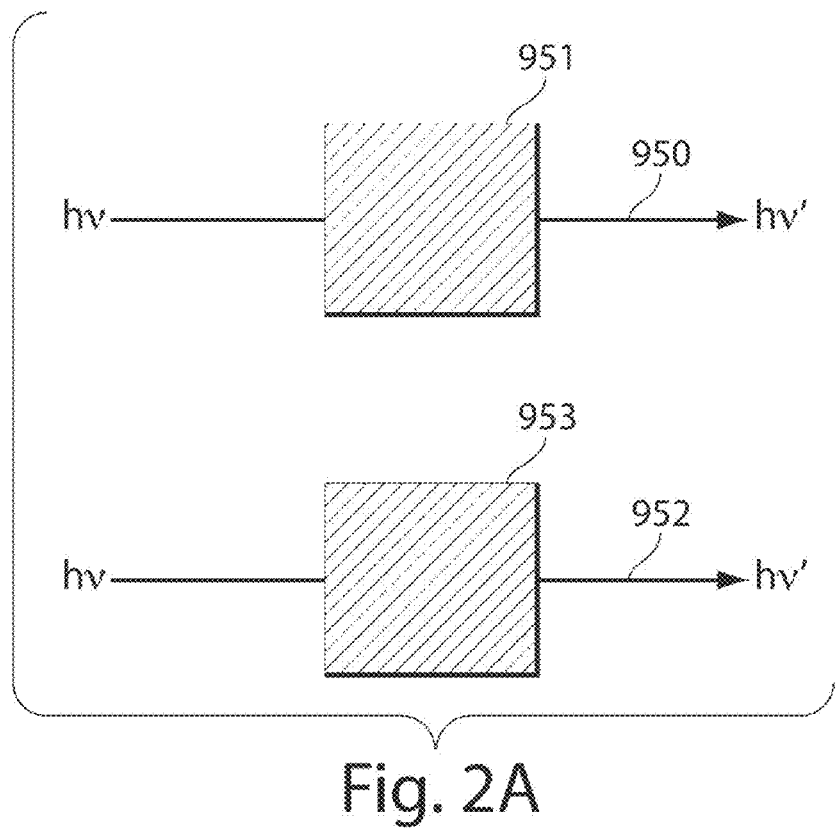
FIGS. 2A-2C schematically show amplified emission of various compositions of the invention in series.
Figure 2B:
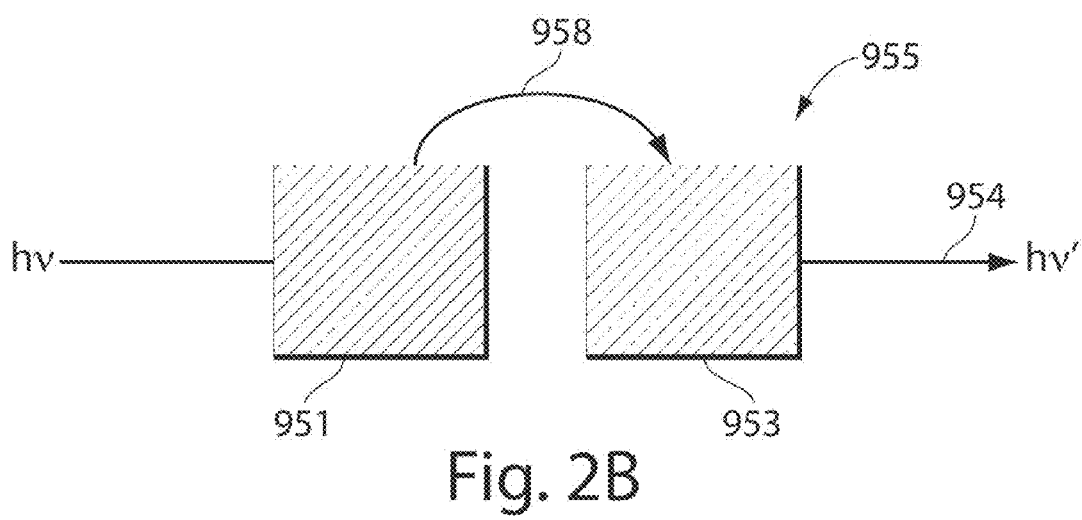
Figure 2C:
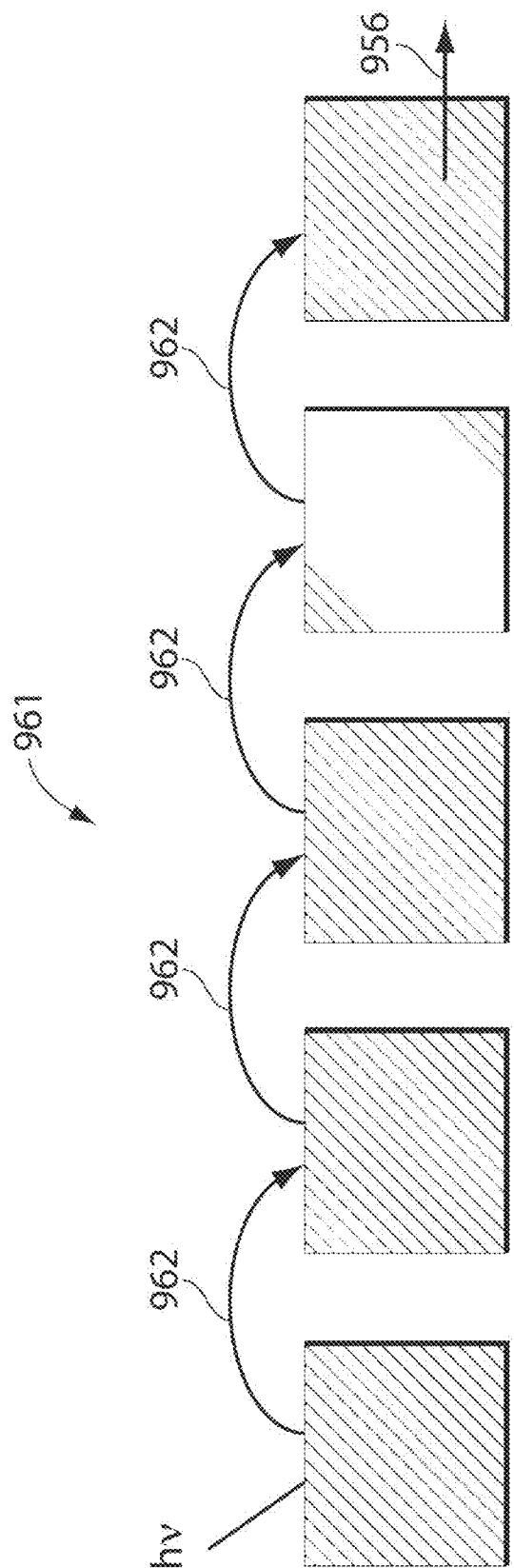
Figure 3A:
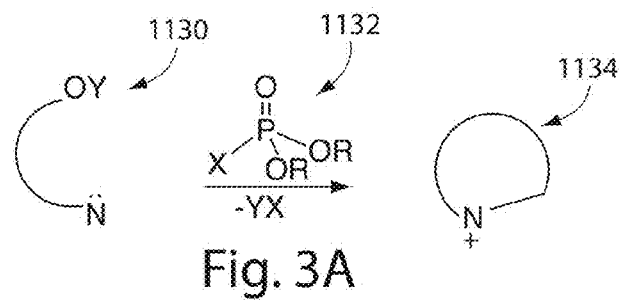
FIGS. 3A-3G show examples of groups that are reactive with phosphate ester groups, according to one embodiment of the invention.
Figure 3B:
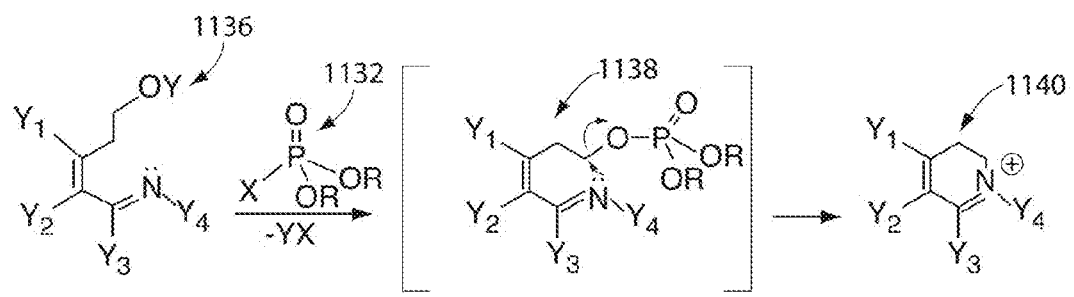
Figure 3C:
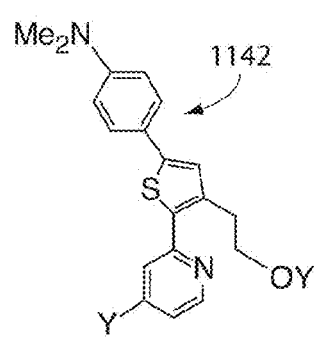
Figure 3D:
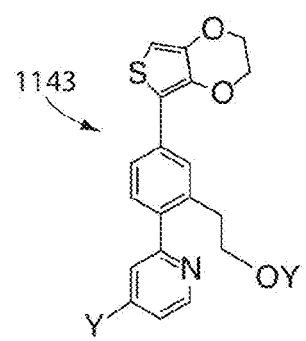
Figure 3E:
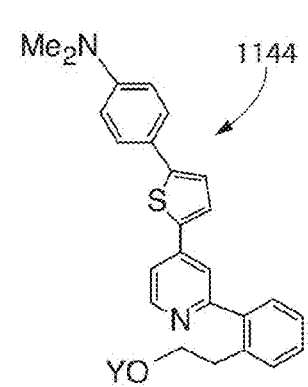
Figure 3F:
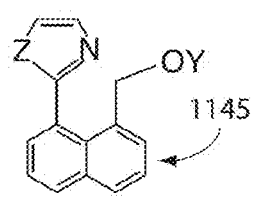
Figure 3G:
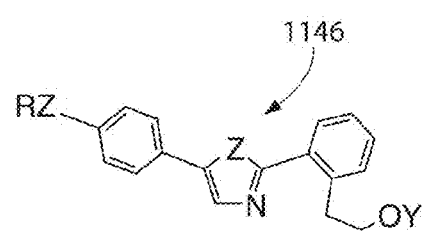

In some embodiments, sensors such as those described above may include more than one composition and/or precursor. For example, in one embodiment, the sensor may comprise a first layer containing a first composition/precursor and a second layer containing a second composition/precursor, the first layer being positioned adjacent or proximate to a second layer. An energy migration pathway is continuous through the first and second layers. Chromophores may be present in the first and second layers. This arrangement is similar to placing amplifiers in series. If an emission of light is initiated in the first layer containing the first composition/precursor and the emitted light is collected from the second layer containing the second composition/precursor, then a net amplification is the product of the amplification contributed by each of the two different composition/precursors may be detected. For example, FIG. 2A shows first and second portions 951 and 953 in parallel within a sensor device (which, e.g., may include layers or other regions of compositions/precursor within the sensor). Emission 950 having a first energy, may be emitted from first portion 951 and emission 952 having a second energy may be emitted from second portion 953. FIG. 2B schematically shows portions 951 and 953 placed in series, (e.g., as a double layer,) and energy can migrate along an energy migration pathway 958 to provide amplified emission 954, which may be thought of as a product of the emissions of compositions 951 and 953 (i.e. emission 950 times emission 952). FIG. 2C shows an article 961 having more than one layer, where energy migration can occur along an energy pathway 962, resulting in enhanced emission 956 from article 961 which can be thought of as a product of the emission of each of the individual portions.

The following examples are intended to illustrate certain aspects of certain embodiments of the present invention, but do not exemplify the full scope of the invention.

EXAMPLE 1

This example illustrates the use of various compositions and precursors of the invention to detect certain highly toxic organophosphonates and other electrophilic phosphorous-containing analytes. Examples of highly toxic organophosphorates include reactive volatile organophosphonates such as tabun, sarin, and soman, which are powerful inhibitors of acetylcholinesterase, an enzyme critical to nerve function. The interruption of this enzyme has rapid and fatal consequences to mammalian life, and is the basis of certain chemical weapons often referred to as "nerve gas." Related, but less toxic compounds, such as diisopropylfluorophospate ("DFP") and diethylchlorophosphate ("DCP"), have generally similar reactivity as the above highly toxic organophosphonates and can also be detected with certain embodiments of the invention, but since these compounds lack the efficacy of typical nerve gas, these compounds can be used more safely as model or "test" compounds that can be detected by various embodiments of the invention.

The sensors described in this example are generally able to respond to the reactivity of the organophosphonates that provides the basis of their toxicity. One mechanism of action of the above-described nerve agents is the reaction of an agent with a hydroxy group to form a phosphate ester at the catalytic site of acetylcholinesterase. The sensors described in this example are generally able to transduce the conversion of a hydroxyl group upon reaction of the agent with a precursor of the invention to form a phosphate ester moiety, and produce a signal indicative of such a reaction. The precursors in this example are able to exhibit bathochromic absorption and fluorescence in response to reaction with an agent and the formation of reactive phosphate esters, indicating the presence of such a reaction. These precursor compositions use intramolecular cyclization reactions, which are able to transform flexible non-planar weakly, non-substantial conjugated chromophores into rigid planar highly delocalized compositions due to cyclization. In addition to generating detectable spectral shifts, the transformation to a rigid cyclized composition may produce a significant increase in the emission efficiency of the composition, relative to the precursor.

Figure 5A:
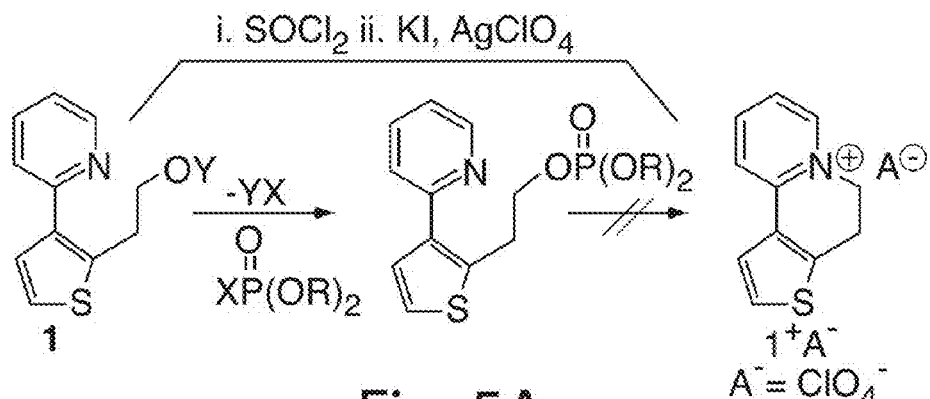
FIGS. 5A-5C illustrate certain compositions/precursors of the invention.
Figure 5B:
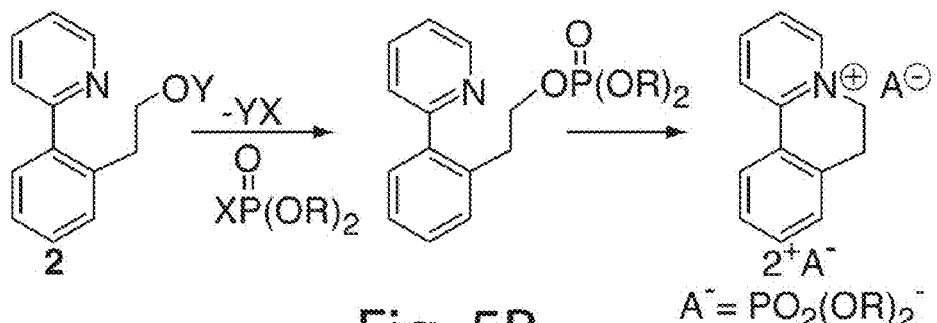
Figure 5C:
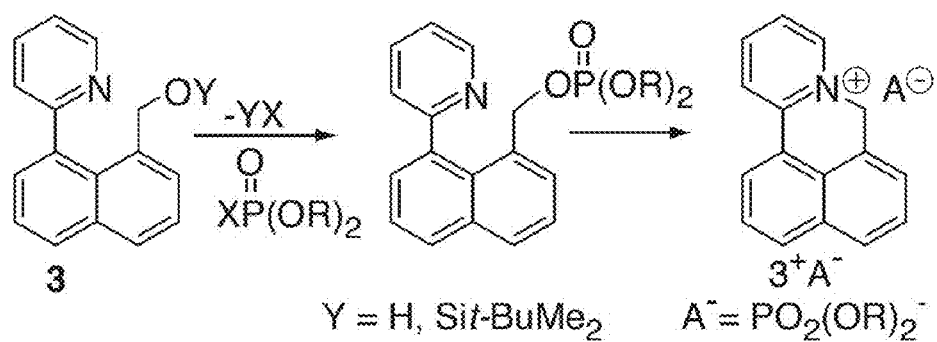

Precursors 1 and 2 in FIG. 5 are thienyl-pyridyl and phenyl-pyridyl systems, respectively. As illustrated in FIG. 5, these precursors were shown to undergo an intramolecular nucleophilic substitution reaction, after the initial formation of a phosphate ester by reaction with a reactive phosphate. The precursors in FIG. 5 were studied as both free alcohols (OH) and silylated ($OSiR_3$) variants, with the silylated group offering preferential specificity for P—F groups such as those found in DFP, sarin, and soman. After cyclization to a cyclized form represented as 1$^+$A$^-$, precursor 1 was shown to have a strong charge transfer optical transition between the electron-rich thienyl group and the electron-poor pyridinium. The cyclized composition was produced under certain forcing conditions. As detailed in Table 1, composition 1$^+$A$^-$ gave significant red shifts and dramatic increases in fluorescence quantum yield upon interaction with an analyte, relative to precursor.

TABLE 1

Spectral data in $CH_2Cl_2$.[b]

| Compound | Abs. Max[a] (log ε) | Em. Max.[a] | Quantum Yield (%) |
|---|---|---|---|
| 1 | 314 (3.88) | 370 | 4.90 |
| 2 | 273 (3.89) | 345 | <0.01 |
| 3 | 291 (4.06) | 385 | 13.1 |
| 1$^+$A$^-$ | 310, 353 (3.71, 3.85) | 412 | 39.6 |
| 2$^+$A$^-$ | 290 (4.12) | 382 | 52.5 |
| 3$^+$A$^-$ | 275, 340 (4.16, 3.84) | 465 | 61.9 |

[a]Given in nm.
[b]Determined on the purified compounds.

Figure 6:
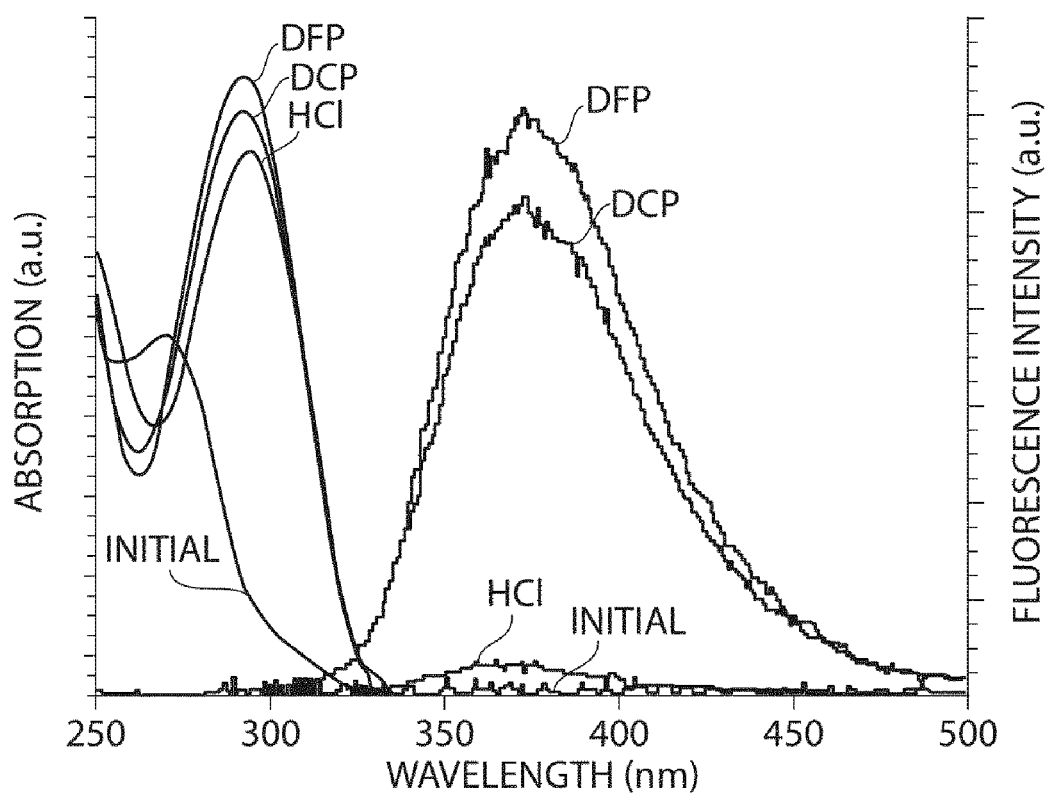
FIG. 6 illustrates absorption and emission spectra for a specific composition of the invention.

Precursor 2, with a phenyl ring in place of the thiophene, had a somewhat more favorable cyclization geometry than precursor 1, and was found to react with both DFP and DCP to give the highly fluorescent cyclized composition 2$^+$A$^-$. As shown in FIG. 6, in contrast, simple protonation of the pyridine nitrogen in precursor 2 by HCl produced a minimal fluorescence response. The specificity of precursor 2 to organophosphonates, illustrated in FIG. 6, was believed to be due to the fact that the aromatic rings in precursor 2 was able to undergo geometrical (vibrational-rotational) changes in the excited state that facilitated non-radiative processes and thus dramatically lower quantum yield. Highly efficient fluorescence was observed in composition 2$^+$A$^-$ after the cyclization reaction, which is believed to cause the elimination of intramolecular rotation about the phenyl-pyridyl bond. The sensitivity of this sensory scheme was directly related to the rate of the cyclization reaction, with higher rates giving lower detection limits. Monitoring the reaction in situ by $^1$H NMR analysis further revealed that the reaction of DFP with precursor 2's alcohol group (1:1 stoichiometry) to form the intermediate phosphate ester was fast, relative to the cyclization reaction of precursor 2. Hence, by reacting precursor 2 (8×10$^{-6}$ M) with a hundred-fold excess of DFP (8×10$^{-4}$ M), the cyclization reaction of precursor 2 was shown to be rate-limiting and could be studied under pseudo first-order kinetics. The emission of composition 2$^+$A$^-$ provided a convenient concentration measurement that proved to be kinetically well-behaved, with a pseudo first-order rate constant of $k_{obs}$=0.0014 s$^{-1}$. Precursor 2's response can also further enhanced by certain amplification methods known to those of ordinary skill in the art.

Figure 7A:
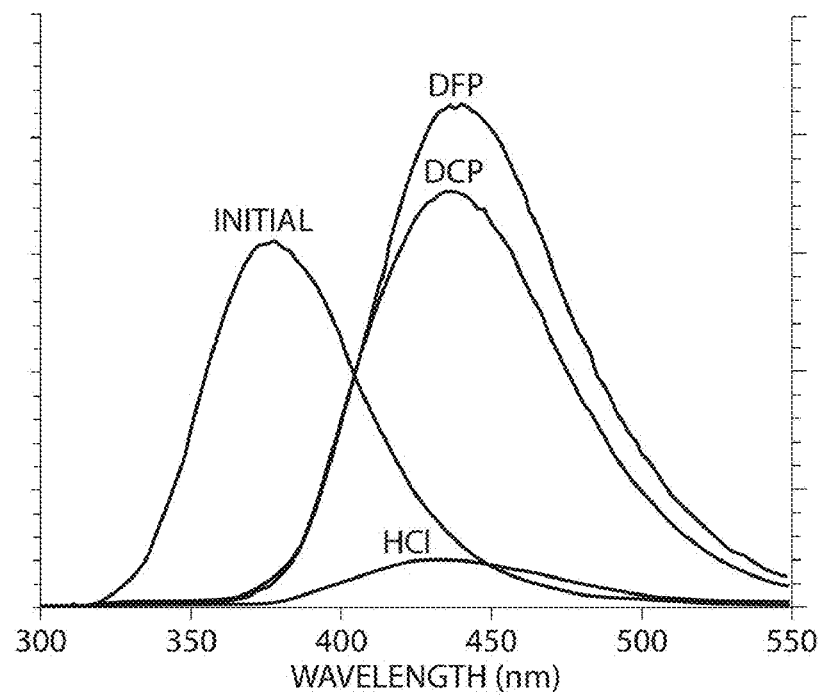
FIGS. 7A and 7B illustrate emission spectra of another composition of the invention.
Figure 7B:
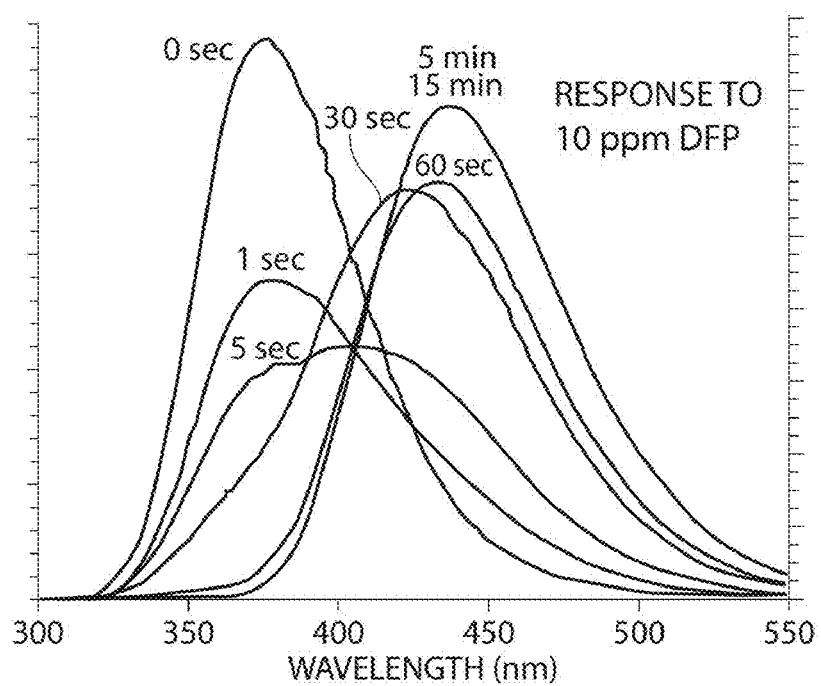
Figure 8:
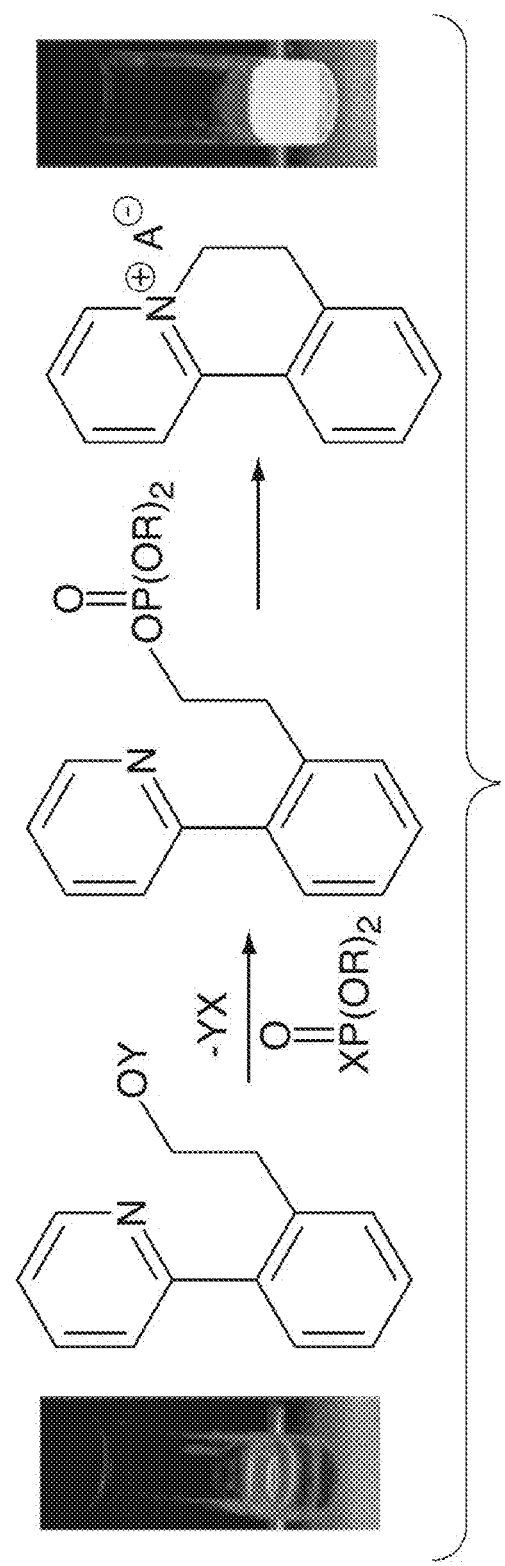
FIG. 8 is a photocopy of a photograph of the fluorescence of a specific composition of the invention used to detect certain chemical warfare indicators, along with the associated reaction, in accordance with one embodiment of the invention.

Precursor 3 was shown in this example to have superior reaction kinetics with respect to precursors 1 and 2, due to the restricted conformation of the naphthalene group that favored intramolecular cyclization and the substitutionally activated alpha-aryl phosphate ester intermediate. Precursor 3 also offered additional spectroscopic advantages upon interaction of the precursor with an analyte, such as longer wavelength emissions and absorptions, as well as relatively strong fluorescence in its native state, which thus allows for precursor 3 to be used directly in certain ratiometric detection schemes. FIG. 7A shows responses of precursor 3$^+$A$^-$ in a cellulose acetate film to DFP, DCP, and HCl. In this thin film, the emission wavelengths were shifted to higher energy relative to the solution values (see Table 1) and occurred at about 375 nm and about 438 nm for precursor 3 and composition 3$^+$A$^-$ respectively, suggesting that the cellulose acetate exhibited less dielectric relaxation about a more polar excited state. The reaction and cyclization rates of precursor 3 were sufficiently fast that detailed kinetics were not possible, and the reaction rate in $CH_2Cl_2$ was estimated to be $k_{obs}$>0.024 s$^{-1}$, or at least 17 times faster than precursor 2. This faster reaction rate is also reflected in the rapid responses of thin films to 10 ppm vapors of DFP (FIG. 7B). The lower quantum yield for composition 3$^+$A$^-$ observed in FIG. 7B at about 1 second and about 5 seconds were likely due to protonation of the pyridine and/or the transient intermediacy of the phosphate ester.

In summary, this example illustrates useful functional sensors for detecting reactive phosphorous compounds such as DFP, as well as actual chemical warfare agents. Given its high sensitivity and specificity, compounds such as precursor 3 may be viable indicators for the detection of certain chemical warfare agents.

EXAMPLE 2

Figure 9:
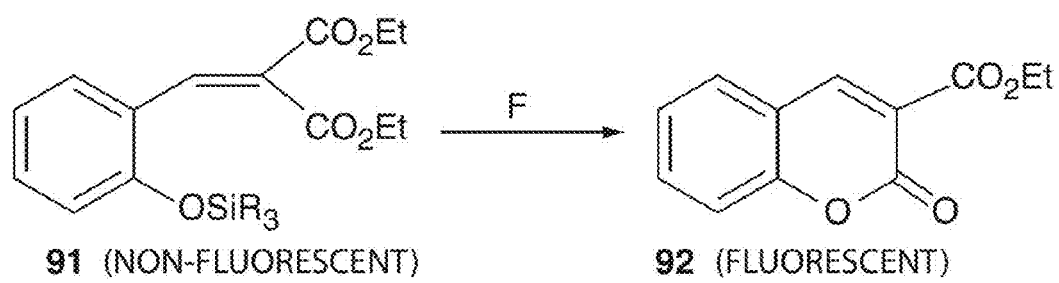
FIG. 9 illustrates a reaction of another embodiment according to the invention.
Figure 10:
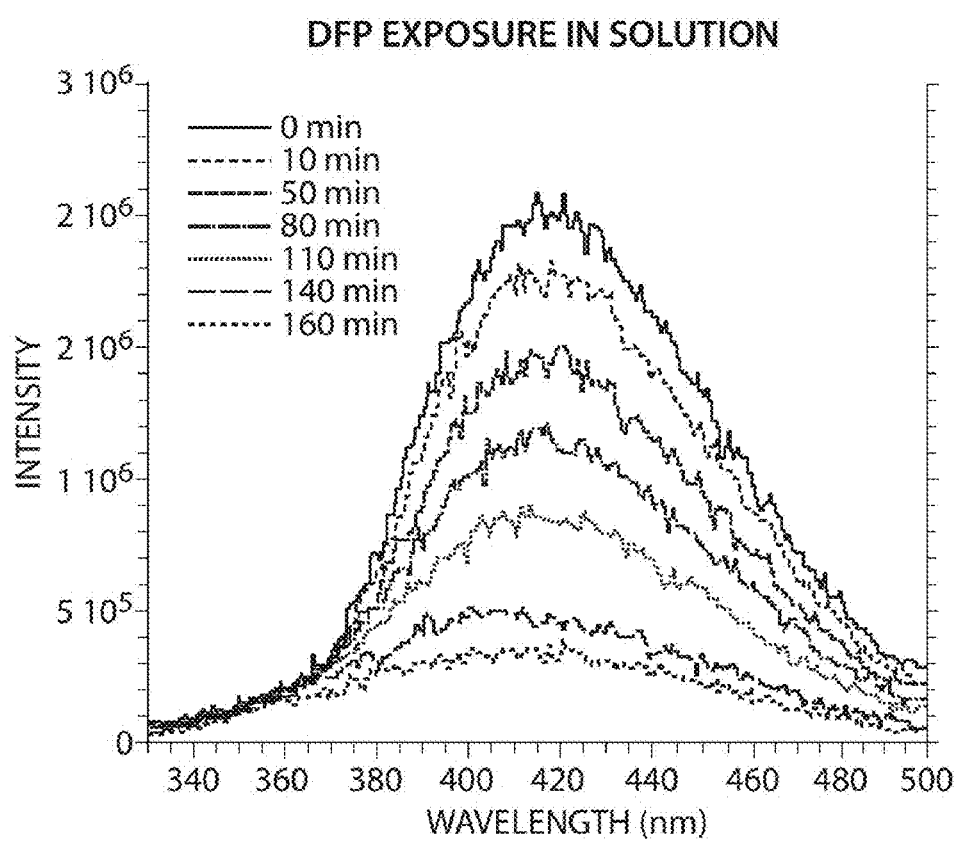
FIG. 10 illustrates the response with respect to time of a composition according to an embodiment of the invention.

This example demonstrates the suitability of compound 91 in FIG. 9 for the detection of certain chemical warfare agents and other electrophilic phosphorous-containing analytes. The hydrolysis of sarin and related agents can produce HF, which can be detected by precursor 91, in a reaction that causes the formation of coumarin composition 92. As shown in FIG. 10, the fluorescence intensity of a sensor containing precursor 91 increased almost proportionally to the time upon exposure to a sarin derivative, DFP. The background emission produced by the sensor may originate from a small amount of coumarin composition 92 formed as a by-product during the synthetic production sequence of precursor 91. The fluorescence signal was amplified in this example for the sensory application.

Precursor 91 included a silyloxy group, and it was also demonstrated in this example that precursor 91 was able to react with a fluoride ion to give a highly fluorescent coumarin composition 92. The anion generated from the Si—O cleavage during reaction with the fluoride ion behaved as a strong nucleophile, and caused a fast cyclization of precursor 91 to coumarin composition 92. The above reaction was found to work under both organic (e.g., TBAF in THF) and aqueous conditions (e.g., CsF or NaF in $H_2O$).

Figure 11A:
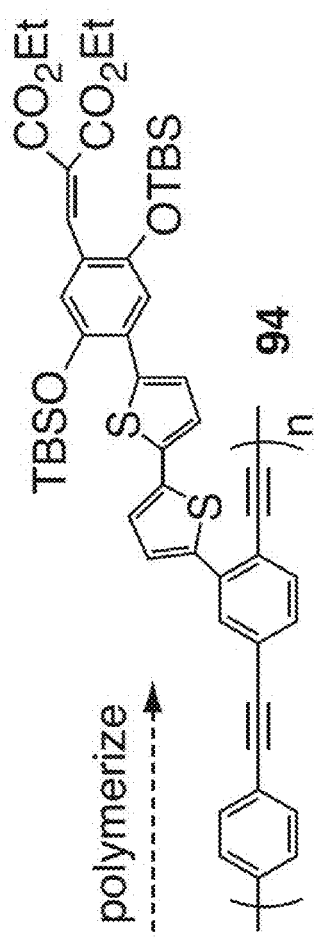
FIGS. 11A-11D illustrate various chemical reactions used in certain embodiments of the invention.
Figure 11A:
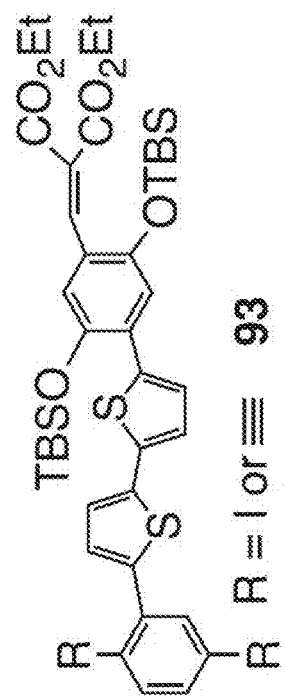

Next, a system was demonstrated where a bithiophene-substituted sensor molecule was incorporated into a conjugated polymer, shown as polymer 94 in FIG. 11A. The exposure of polymer 94 to either fluoride or DFP was found to cause the formation of a new bandgap of the conjugated polymer, leading to detectable amplified wavelength shifts of the polymer. Further, the bithiophene was found to bring the emission wavelength of the resulting polymer to near the visible range.

Figure 11B:
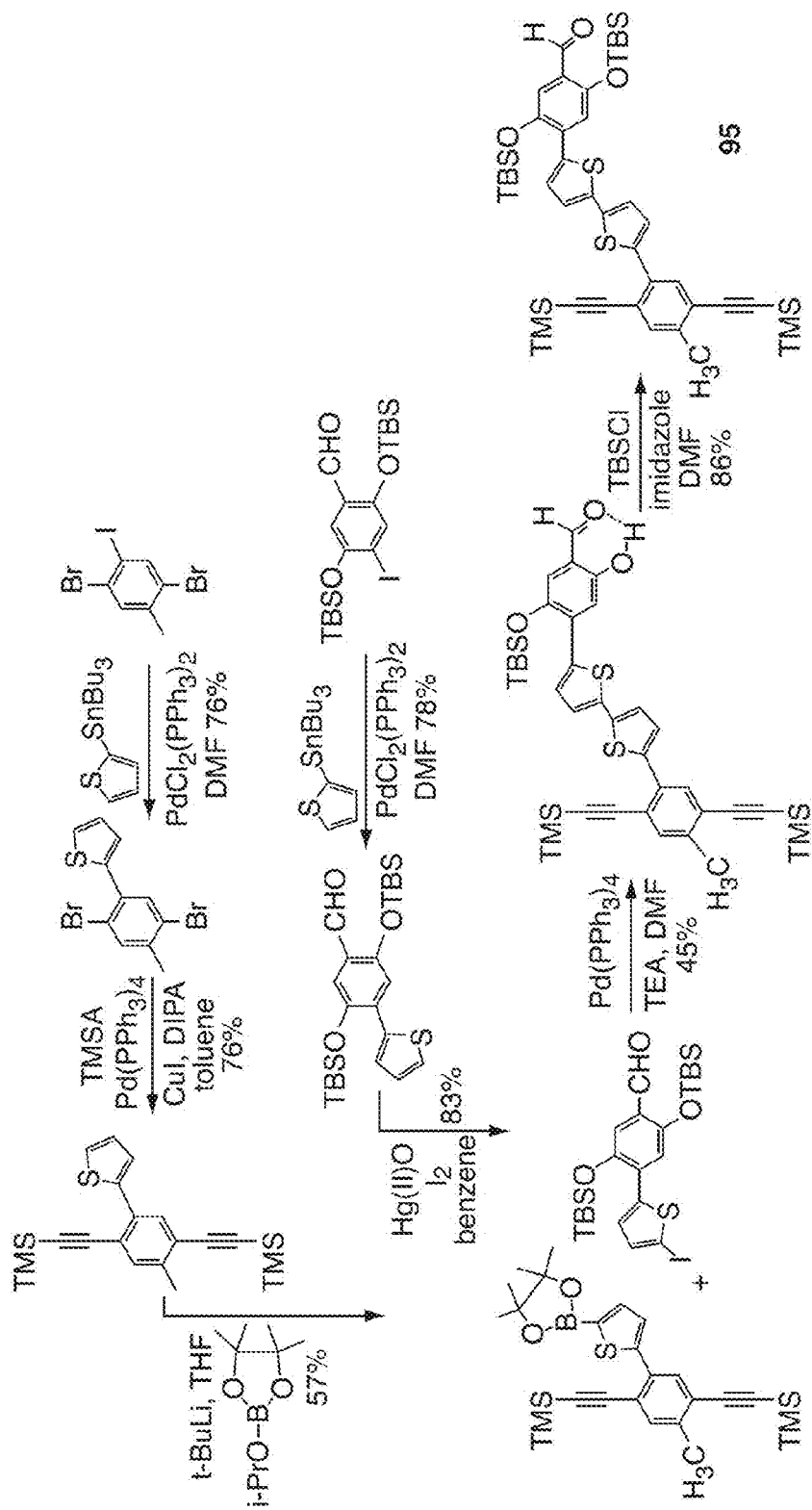
Figure 11C:
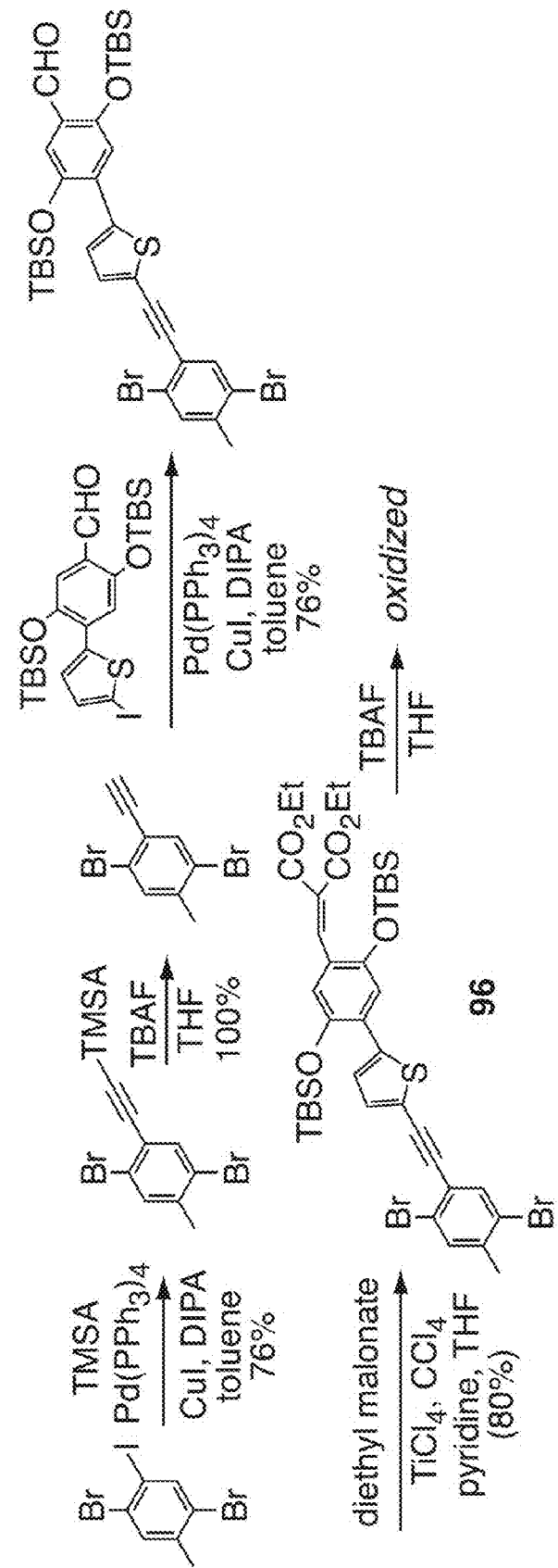
Figure 11D:
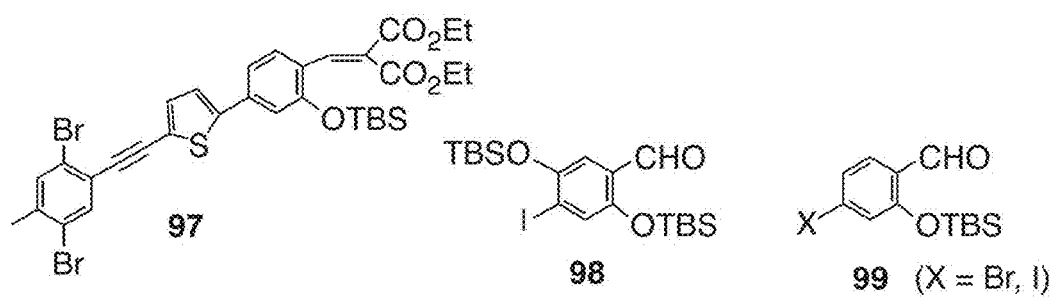

The preparation of polymer 94 required the synthesis of monomer 93, which was prepared as follows (see FIG. 11B). Molecule 95, a precursor of monomer 93, was first synthesized by divergent synthesis and then separately synthesized by a more efficient convergent synthesis. The optimized conditions for the divergent synthesis pathway are shown in FIG. 11B. As the synthesis of molecule 95 using divergent synthesis involved several difficult purifications, a simpler approach was also devised using a convergent synthesis approach, shown in FIG. 11C. The target molecule was modified slightly as monomer 96 in FIG. 11C. The synthesis of monomer 96 using convergent synthesis involved fewer steps and gave a much higher yield than did the divergent synthesis pathway. This approach also involved a modular strategy, and this modular strategy can also be applied to the preparation of various other polymers of the invention. For example, other monomers, such as those illustrated in FIG. 11D, useful for producing certain polymers of the invention, can be synthesized using techniques similar to those described in this example.

While several embodiments of the invention have been described and illustrated herein, those of ordinary skill in the art will readily envision a variety of other means and structures for performing the functions and/or obtaining the results or advantages described herein, and each of such variations or modifications is deemed to be within the scope of the present invention. More generally, those skilled in the art would readily appreciate that all parameters, dimensions, materials, and configurations described herein are meant to be exemplary and that actual parameters, dimensions, materials, and configurations will depend upon specific applications for which the teachings of the present invention are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described. The present invention is directed to each individual feature, system, material and/or method described herein. In addition, any combination of two or more such features, systems, materials and/or methods, if such features, systems, materials and/or methods are not mutually inconsistent, is included within the scope of the present invention.

In the claims (as well as in the specification above), all transitional phrases such as "comprising," "including," "carrying," "having," "containing," "involving," and the like are to be understood to be open-ended, i.e. to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:
1. A sensor, comprising:
a substrate comprising a compound having a structure:

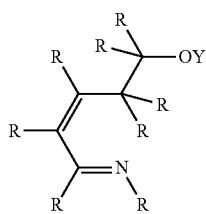

wherein:
each R is independently hydrogen, alkyl, or an aromatic group, or two R groups can be joined together to form an aromatic group; and
Y is H or SiR'$_3$, each R' independently being one of hydrogen, alkyl, or aryl a source of energy applicable to the compound to cause an emission of radiation; and
an emission detector positioned to detect the emission.

2. The sensor of claim 1, wherein at least a portion of the compound is able to undergo an intramolecular cyclization reaction upon reaction of the compound with an electrophile to form a cyclized product, wherein the electrophile comprises a phosphate ester.

3. The sensor of claim 2, wherein the electrophile comprises an electrophilic phosphorous, sulfur, or arsenic atom.

4. The sensor of claim 3, wherein the electrophilic phosphorous, sulfur, or arsenic atom is bonded to more than one electron-withdrawing moiety.

5. The sensor of claim 2, wherein the electrophile comprises an electrophilic carbon that is multiply-bonded another electrophilic atom.

6. The sensor of claim 2, wherein the electrophile is a chemical warfare agent.

7. The sensor of claim 1, wherein at least a portion of the compound undergoes an intramolecular cyclization reaction upon reaction with an electrophile to form a cyclized product, the intramolecular cyclization reaction comprising an intramolecular nucleophilic substitution reaction.

8. The sensor of claim 7, wherein the cyclized product has a greater emissivity than the compound.

9. The sensor of claim 1, wherein the compound has the following structure,

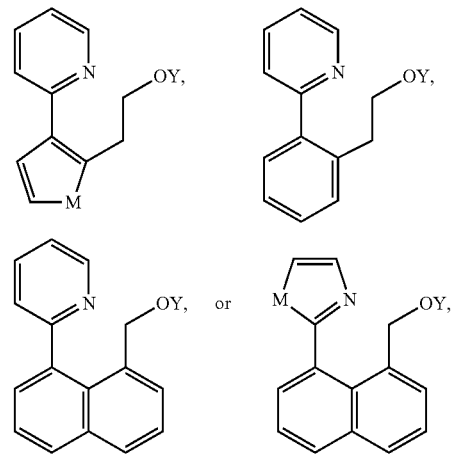

wherein:
M is oxygen or sulfur.

10. The sensor of claim 2, wherein the electrophile is sarin, phosgene, soman, tabun, thionyl chloride,

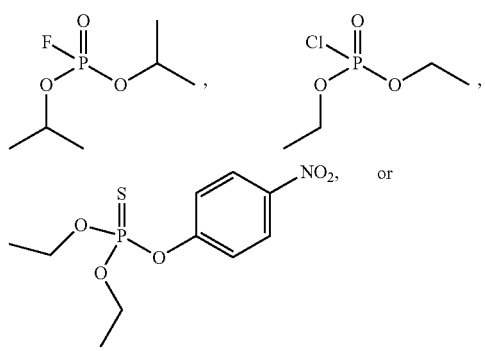

-continued

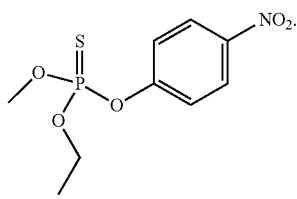

11. A method, comprising:

reacting a compound with an electrophile to produce a product having greater emissivity than the compound, wherein the product comprises at least a portion of the compound that has been cyclized upon reaction with the electrophile, wherein the compound has the following structure,

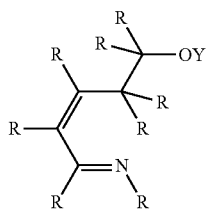

wherein:

each R is independently hydrogen, alkyl, or an aromatic group, or two R groups can be joined together to form an aromatic group; and Y is H or SiR'$_3$, each R' independently being one of hydrogen, alkyl, or aryl.

12. A method, comprising:

cyclizing at least a portion of a compound by reacting the compound with an electrophile, the compound having a structure:

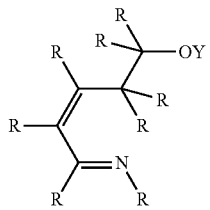

wherein:

each R is independently hydrogen, alkyl, or an aromatic group, or two R groups can be joined together to form an aromatic group; and Y is H or SiR'$_3$, each R' independently being one of hydrogen, alkyl, or aryl.

13. The method of claim 11, wherein the electrophile is sarin, phosgene, soman, tabun, thionyl chloride,

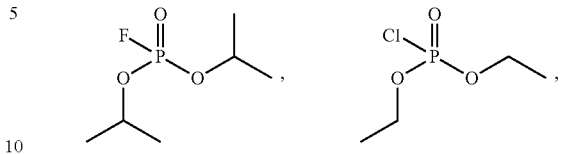

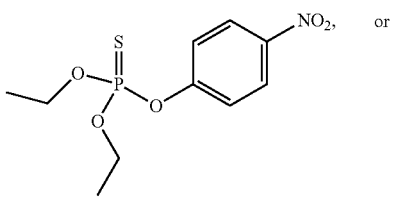 or

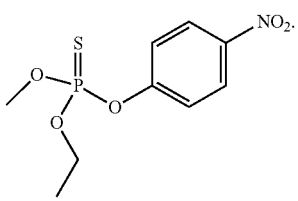

14. The method of claim 11, wherein two R groups are joined together to form an aromatic group selected from the group consisting of a benzene ring, a pyridine ring, a naphthalene ring, an anthracene ring, a pyridine ring, a quinoline ring, a thiophene ring, a furan ring, a quinolizine ring, and an iptycene moiety.

15. The method of claim 11, wherein the compound has the following structure,

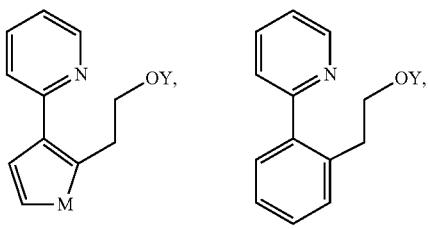

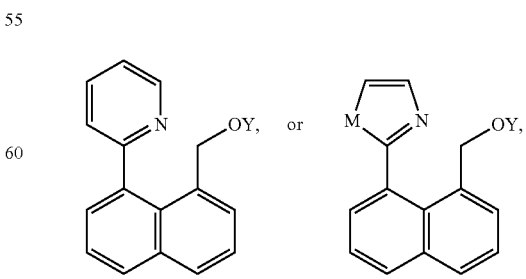

wherein M is oxygen or sulfur.

16. The method of claim 12, wherein the electrophile is sarin, phosgene, soman, tabun, thionyl chloride,

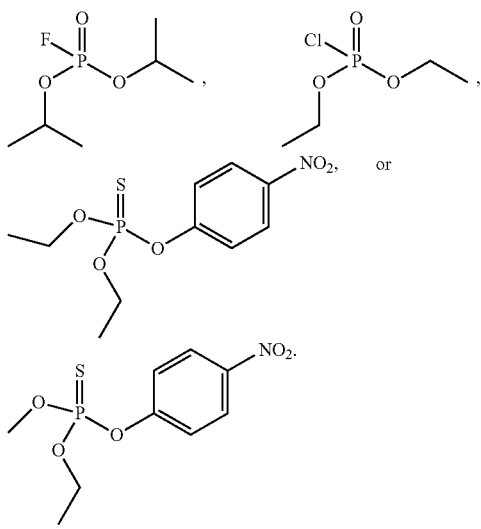

17. The method of claim 12, wherein two R groups are joined together to form an aromatic group selected from the group consisting of a benzene ring, a pyridine ring, a naphthalene ring, an anthracene ring, a pyridine ring, a quinoline ring, a thiophene ring, a furan ring, a quinolizine ring, and an iptycene moiety.

18. The method of claim 12, wherein the compound has the following structure,

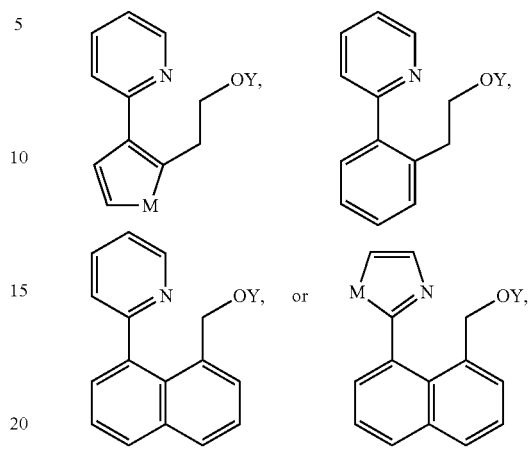

wherein M is oxygen or sulfur.

19. The sensor of claim 1, wherein two R groups are joined together to form an aromatic group selected from the group consisting of a benzene ring, a pyridine ring, a naphthalene ring, an anthracene ring, a pyridine ring, a quinoline ring, a thiophene ring, a furan ring, a quinolizine ring, and an iptycene moiety.

* * * * *